(12) United States Patent
Yang et al.

(10) Patent No.: US 12,301,117 B2
(45) Date of Patent: May 13, 2025

(54) CONTROLLERS AND METHODS FOR DETECTING AND ADJUSTING VOLTAGE DROPS RELATED TO TRANSISTORS IN POWER CONVERTERS

(71) Applicant: ON-BRIGHT ELECTRONICS (SHANGHAI) CO., LTD., Shanghai (CN)

(72) Inventors: Penglin Yang, Shanghai (CN); Yaming Cao, Shanghai (CN); Yuan Lin, Shanghai (CN); Lieyi Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 178 days.

(21) Appl. No.: 18/111,853

(22) Filed: Feb. 20, 2023

(65) Prior Publication Data
US 2023/0291315 A1    Sep. 14, 2023

(30) Foreign Application Priority Data

Jan. 27, 2022 (CN) .......................... 202210102629.1

(51) Int. Cl.
*H02M 3/335* (2006.01)
*G01R 31/36* (2020.01)

(52) U.S. Cl.
CPC ........ *H02M 3/33507* (2013.01); *G01R 31/36* (2013.01)

(58) Field of Classification Search
CPC ............ H02M 3/22; H02M 1/08; H02M 1/36; H02M 3/24; H02M 3/325; H02M 3/335;
(Continued)

(56) References Cited

U.S. PATENT DOCUMENTS 6,385,059 B1    5/2002 Telefus et al.
9,674,903 B2    6/2017 Moon et al.
(Continued)

FOREIGN PATENT DOCUMENTS

CN    103066855 A    4/2013
CN    107426874 A    12/2017
(Continued)

OTHER PUBLICATIONS

Taiwan Patent Office, Office Action mailed Nov. 10, 2023, in Application No. 112117187.
(Continued)

*Primary Examiner* — Jeffrey A Gblende
(74) *Attorney, Agent, or Firm* — Faegre Drinker Biddle & Reath LLP

(57) ABSTRACT

Controller and method for a power converter. For example, a controller for a power converter includes: a first gate driver configured to output a first drive signal to a first transistor related to a primary winding, the first transistor including a drain terminal and a source terminal, the primary winding being configured to receive an input voltage, the primary being coupled to a first auxiliary winding and a second auxiliary winding; one or more voltage detectors configured to generate a first detection signal and a second detection signal based at least in part on a current signal related to the first auxiliary winding; a time controller configured to receive the first detection signal and the second detection signal and generate a control signal based at least in part on the first detection signal and the second detection signal; and a second gate driver configured to receive the control signal.

20 Claims, 19 Drawing Sheets

(58) Field of Classification Search
CPC ...... H02M 3/28; H02M 3/01; H02M 3/33569; H02M 3/33507; H02M 2007/4815; H02M 2007/4818; H02M 1/083; H02M 3/33538; H02M 3/33546; H02M 3/33515; H02M 3/33576; H02M 3/33592; H02M 3/33553; H02M 3/33523; H02M 3/33561; H02M 3/155; H02M 3/1582; H02M 1/4233; H02M 1/12; H02M 3/07; H02M 7/219; H02M 7/4815; H02M 1/0048; H02M 7/4818; H02M 7/4826; H02M 7/4833; Y02B 70/1491

See application file for complete search history.

(56) References Cited

U.S. PATENT DOCUMENTS

| | | | |
|---|---|---|---|
| 10,103,616 | B1 | 10/2018 | Lin et al. |
| 10,277,131 | B2 | 4/2019 | Zhang et al. |
| 11,205,950 | B2* | 12/2021 | Lau .................. H02M 1/0006 |
| 11,451,155 | B2* | 9/2022 | Ng .................. H02M 3/33569 |
| 2014/0133192 | A1 | 5/2014 | Lin et al. |
| 2014/0140109 | A1 | 5/2014 | Valley |
| 2019/0222131 | A1 | 7/2019 | King |
| 2020/0112241 | A1* | 4/2020 | Wang .................. H02M 3/33523 |
| 2021/0006147 | A1 | 1/2021 | Feldtkeller |
| 2023/0283165 | A1 | 9/2023 | Fang et al. |
| 2023/0327570 | A1 | 10/2023 | Yang et al. |
| 2024/0313657 | A1 | 9/2024 | Fang et al. |
| 2024/0322695 | A1 | 9/2024 | Fang et al. |

FOREIGN PATENT DOCUMENTS

| | | |
|---|---|---|
| CN | 108809107 A | 11/2018 |
| CN | 211237683 U | 8/2020 |
| CN | 113193758 A | 7/2021 |
| CN | 113708631 A | 11/2021 |
| CN | 113992018 A | 1/2022 |
| CN | 115224951 A | 10/2022 |
| CN | 115360918 A | 11/2022 |
| CN | 115694145 A | 2/2023 |
| JP | 2016-042765 A | 3/2016 |
| TW | 201603444 A | 1/2016 |
| TW | 201926877 A | 7/2019 |
| TW | 202008703 A | 2/2020 |
| TW | 202201891 A | 1/2022 |
| TW | M623787 U | 2/2022 |
| TW | 202230940 A | 8/2022 |

OTHER PUBLICATIONS

Taiwan Patent Office, Office Action mailed Nov. 10, 2023, in Application No. 112117188.
Taiwan Patent Office, Office Action mailed Nov. 16, 2023, in Application No. 111123512.
Taiwan Patent Office, Office Action mailed Oct. 23, 2023, in Application No. 111122734.
Taiwan Patent Office, Office Action mailed Sep. 12, 2023, in Application No. 111126161.
United States Patent and Trademark Office, Notice of Allowance mailed Mar. 21, 2025, in U.S. Appl. No. 18/118,003.
United States Patent and Trademark Office, Notice of Allowance mailed Mar. 5, 2025, in U.S. Appl. No. 18/125,559.

* cited by examiner

CONTROLLERS AND METHODS FOR DETECTING AND ADJUSTING VOLTAGE DROPS RELATED TO TRANSISTORS IN POWER CONVERTERS

1. CROSS-REFERENCES TO RELATED APPLICATIONS

This application claims priority to Chinese Patent Application No. 202210102629.1, filed Jan. 27, 2022, incorporated by reference herein for all purposes.

2. BACKGROUND OF THE INVENTION

Certain embodiments of the present invention are directed to circuits. More particularly, some embodiments of the invention provide controllers and methods for detecting and adjusting voltage drops related to transistors. Merely by way of example, some embodiments of the invention have been applied to quasi-resonant switch-mode power converters. But it would be recognized that the invention has a much broader range of applicability.

The power converters can convert electric power from one form to another form. As an example, the electric power is transformed from alternate current (AC) to direct current (DC), from DC to AC, from AC to AC, or from DC to DC. Additionally, the power converters can convert the electric power from one voltage level to another voltage level. The power converters include linear converters and switch-mode converters. The switch-mode converters often are implemented with various architectures, such as the fly-back architecture, the buck architecture, and/or the boost architecture. Fly-back switch-mode power converters, especially ones with low-voltage switching and/or zero-voltage switching (ZVS), are often used as power supply devices because of their small size, high frequency, and/or high power density.

FIG. 1 is a simplified diagram showing a conventional fly-back quasi-resonant switch-mode power converter. The fly-back quasi-resonant switch-mode power converter 100 includes a primary winding 112, a secondary winding 114, and an auxiliary winding 116, a quasi-resonant controller 120, resistors 140 and 142, and a transistor 150. In some examples, the primary winding 112, the secondary winding 114, and the auxiliary winding 116 are parts of a transformer. In certain examples, the transistor 150 includes a parasitic capacitor 152. For example, the transistor 150 is a metal-oxide-semiconductor field-effect transistor (MOSFET), a NPN bipolar junction transistor (BJT), an insulated-gate bipolar transistor (IGBT), and/or a gallium nitride (GaN) transistor. As an example, the transistor 150 includes a drain terminal 154, a gate terminal 156, and a source terminal 158.

The parasitic capacitor 152 and the primary winding 112 are parts of an LC resonant circuit. The primary winding 112 receives a voltage 115. When the transistor 150 becomes turned off, the primary winding 112 starts undergoing a demagnetization process. After the demagnetization process has ended, the parasitic capacitor 152 and the primary winding 112 start going through a resonance process, during which the voltage drop from the drain terminal 154 to the source terminal 158 of the transistor 150 changes between a peak magnitude and a valley magnitude. The voltage drop from the drain terminal 154 to the source terminal 158 of the transistor 150 is equal to the voltage at the drain terminal 154 minus the voltage at the source terminal 158.

As shown in FIG. 1, the quasi-resonant controller 120 receives a voltage 141 that is generated by the resistors 140 and 142 and outputs a drive voltage 151 to the gate terminal 156 of the transistor 150. If the voltage 141 drops below a predetermined threshold, the quasi-resonant controller 120 determines that the demagnetization process has already ended. After the end of the demagnetization process, the voltage 141 undergoes resonance. During the resonance, when the voltage 141 becomes smaller than another predetermined threshold (e.g., 100 mV), the transistor 150 is turned on. After the transistor 150 is turned on, a current 113 that flows through the transistor 150 has a magnitude that is larger than zero.

FIG. 2 shows simplified timing diagrams for the conventional fly-back quasi-resonant switch-mode power converter 100 as shown in FIG. 1. The waveform 210 represents the voltage drop from the drain terminal 154 to the source terminal 158 of the transistor 150 as a function of time, the waveform 251 represents the drive voltage 151 as a function of time, and the waveform 213 represents the current 113 as a function of time.

From time $t_0$ to time $t_1$, the drive voltage 151 remains at a logic high level and the transistor 150 remains turned on as shown by the waveform 251. Also, from time $t_0$ to time $t_1$, the voltage drop from the drain terminal 154 to the source terminal 158 of the transistor 150 remains equal to zero volts as shown by the waveform 210, and the current 113 that flows through the transistor 150 increases from zero to a peak value 220 as shown by the waveform 213.

At time $t_1$, the drive voltage 151 changes from the logic high level to a logic low level and the transistor 150 becomes turned off as shown by the waveform 251. Also, at time $t_1$, the current 113 that flows through the transistor 150 drops from the peak value 220 to zero. From time $t_1$ to time $t_2$, the primary winding 112 undergoes a demagnetization process as shown by the waveform 210. Also, from time $t_1$ to time $t_2$, the drive voltage 151 remains at the logic low level and the transistor 150 remains turned off as shown by the waveform 251, and the current 113 remains equal to zero as shown by the waveform 213.

At time $t_2$, the demagnetization process of the primary winding 112 ends, as shown by the waveform 210. From time $t_2$ to time $t_3$, the parasitic capacitor 152 and the primary winding 112 undergo a resonance process as shown by the waveform 210. Also, from time $t_2$ to time $t_3$, the drive voltage 151 remains at the logic low level and the transistor 150 remains turned off as shown by the waveform 251, and the current 113 remains equal to zero as shown by the waveform 213.

At time $t_3$, the voltage 141 becomes smaller than a predetermined threshold (e.g., 100 mV), and in response the quasi-resonant controller 120 changes the drive voltage 151 from the logic low level to the logic high level and turns on the transistor 150 as shown by the waveform 251. Also, at time $t_3$, immediately before the transistor 150 becomes tuned on, the voltage drop from the drain terminal 154 to the source terminal 158 of the transistor 150 is equal to a voltage value 230 as shown by the waveform 210.

As shown in FIG. 1 and FIG. 2, the conventional fly-back quasi-resonant switch-mode power converter 100 often can reduce the switching loss, but the voltage value 230 of the voltage drop from the drain terminal 154 to the source terminal 158 at which the transistor 150 becomes turned on still can be too high. Therefore, the switching loss of the conventional fly-back quasi-resonant switch-mode power converter 100 often is still too high, especially when the voltage 115 is high, as shown by Equation 1.

$$P_{sw} = \frac{1}{2} \times C_p \times (V_{230})^2 \times f_{sw} \quad \text{(Equation 1)}$$

where $P_{sw}$ represents the switching loss of the transistor 150. Additionally, $C_p$ represents the capacitance of the parasitic capacitor 152, and $f_{sw}$ represents the switching frequency of the transistor 150. Also, $V_{230}$ represents the voltage value 230 of the voltage drop from the drain terminal 154 to the source terminal 158 at which the transistor 150 becomes turned on.

FIG. 3 is a simplified diagram showing a conventional quasi-resonant switch-mode power converter with zero-voltage switching. The quasi-resonant switch-mode power converter 300 includes a primary winding 312, a secondary winding 314, auxiliary windings 316 and 318, a controller chip 320, resistors 340, 342 and 344, transistors 350 and 360, a capacitor 362, an error amplification and isolation unit 372, and a diode 388. For example, the controller chip 320 includes resistors 380 and 382, a diode 332, an oscillator 334, a comparator 336, a flip flop 338, an on-time controller 370, a dead-time controller 374, and gate drivers 376 and 378. As an example, the controller chip 320 also includes terminals 322, 324, 326, and 328 (e.g., pins). In some examples, the transistor 350 includes a parasitic capacitor 352. In certain examples, the primary winding 312, the secondary winding 314, and the auxiliary windings 316 and 318 are parts of a transformer.

The transistor 350 includes a drain terminal 354, a gate terminal 356, and a source terminal 358, and the transistor 360 includes a drain terminal 364, a gate terminal 366, and a source terminal 368. The gate driver 378 of the controller chip 320 generates a drive voltage 351, and the gate driver 376 of the controller chip 320 generates a drive voltage 335. The drive voltage 351 is received by the gate terminal 356 of the transistor 350, and the drive voltage 335 is received by the gate terminal 366 of the transistor 360. If the drive voltage 351 is at the logic high level, the transistor 350 is turned on, and if the drive voltage 351 is at the logic low level, the transistor 350 is turned off. If the drive voltage 335 is at the logic high level, the transistor 360 is turned on, and if the drive voltage 335 is at the logic low level, the transistor 360 is turned off. The resistors 340 and 342 generate a voltage 341, and the error amplification and isolation unit 372 generates a feedback signal 373, which is received by the diode 332.

As shown in FIG. 3, the quasi-resonant switch-mode power converter 300 receives an AC input voltage 390 and generates an output voltage 392. Additionally, a current 313 flows through the primary winding 312. Moreover, a current 363 flows through the auxiliary winding 318. Also, the primary winding 312 receives a voltage 315. The capacitor 362 includes terminals 394 and 396.

The on-time controller 370 receives a signal 371 and generates a control signal 377 based at least in part on the signal 371. If the signal 371 changes from a logic low level to a logic high level, the control signal 377 also changes from the logic low level to the logic high level in order to turn on the transistor 360. For example, the time duration when the control signal 377 remains at the logic high level (e.g., the time duration when the transistor 360 remains turned on) has a predetermined length. As an example, the time duration when the control signal 377 remains at the logic high level (e.g., the time duration when the transistor 360 remains turned on) is determined based on the voltage 315. The control signal 377 indicates the length of the time duration when the transistor 360 remains turned on. The control signal 377 is received by the dead-time controller 374 and the gate driver 376. The gate driver 376 generates the drive voltage 335 to turn on and/or turn off the transistor 360 based at least in part on the control signal 377.

The dead-time controller 374 receives the control signal 377 and generates a dead-time signal 375 based at least in part on the control signal 377. For example, the dead-time signal 375 represents a delay from the time when the drive voltage 335 changes from a logic high level to a logic low level to the time when the drive voltage 351 changes from the logic low level to the logic high level (e.g., a delay from the time when transistor 360 becomes tuned off to the time when the transistor 350 becomes turned on). The dead-time signal 375 is received by the oscillator 334, which also receives a voltage 381 that is generated by the resistors 380 and 382.

The resistor 380 is connected to the diode 332 and the resistor 382, and the resistors 380 and 382 output the voltage 381 to the oscillator 334 and the comparator 336. The comparator 336 also receives a voltage 345 that is generates by the resistor 344 connected to the source terminal 358 of the transistor 350. In response, the comparator 336 generates a comparison signal 337, which is received by the flip flop 338.

The oscillator 334 receives the dead-time signal 375 and the voltage 381 and generates the signal 371 and a signal 343 based at least in part on the dead-time signal 375 and the voltage 381. The signal 343 is received by the flip flop 338, which also receives the comparison signal 337 from the comparator 336 and generates a signal 339 based at least in part on the signal 335 and the comparison signal 337. The signal 339 is received by the gate driver 378, which in response generates the drive voltage 351 to turn on and/or turn off the transistor 350.

FIG. 4 shows simplified timing diagrams for the conventional fly-back quasi-resonant switch-mode power converter 300 as shown in FIG. 3. The waveform 410 represents the voltage drop from the drain terminal 354 to the source terminal 358 of the transistor 350 as a function of time, the waveform 413 represents the current 313 as a function of time, the waveform 463 represents the current 363 as a function of time, the waveform 451 represents the drive voltage 351 as a function of time, and the waveform 435 represents the drive voltage 335 as a function of time. The voltage drop from the drain terminal 354 to the source terminal 358 of the transistor 350 is equal to the voltage at the drain terminal 354 minus the voltage at the source terminal 358.

From time $t_{10}$ to time $t_{11}$, the drive voltage 351 remains at a logic high level, and the transistor 350 remains turned on as shown by the waveform 451. Also, from time $t_{10}$ to time $t_{11}$, the voltage drop from the drain terminal 354 to the source terminal 358 of the transistor 350 remains equal to zero volts as shown by the waveform 410, and the current 313 that flows from the primary winding 312 to the transistor 350 increases from zero to a positive current value 420 as shown by the waveform 413. Additionally, from time $t_{10}$ to time $t_{11}$, the drive voltage 335 remains at a logic low level, and the transistor 360 remains turned off as shown by the waveform 435. Moreover, the current 363 remains equal to zero as shown by the waveform 463.

At time $t_{11}$, the drive voltage 351 changes from the logic high level to a logic low level, and the transistor 350 becomes turned off as shown by the waveform 451. Also, at time $t_{11}$, the primary winding 312 starts undergoing a demagnetization process as shown by the waveform 410, and the diode 388 becomes forward biased and turned on.

Additionally, at time $t_{11}$, the current 313 that flows from the primary winding 312 to the transistor 350 drops from the positive current value 420 to zero as shown by the waveform 413. Moreover, at time $t_{11}$, the drive voltage 335 remains at the logic low level, and the transistor 360 remains turned off as shown by the waveform 435. Also, at time $t_{11}$, the current 363 that flows from the auxiliary winding 318 to the capacitor 362 without going through the transistor 360 rises from zero to a positive current value 430 as shown by the waveform 463, and the capacitor 362 is charged by the current 363.

From time $t_{11}$ to time $t_{12}$, the drive voltage 351 remains at the logic low level, and the transistor 350 remains turned off as shown by the waveform 451. Also, from time $t_{11}$ to time $t_{12}$, the primary winding 312 undergoes the demagnetization process as shown by the waveform 410, and the current 313 remains equal to zero as shown by the waveform 413. Additionally, from time $t_{11}$ to time $t_{12}$, the drive voltage 335 remains at the logic low level, and the transistor 360 remains turned off as shown by the waveform 435. Moreover, from time $t_{11}$ to time $t_{12}$, the current 363 that flows from the auxiliary winding 318 to the capacitor 362 without going through the transistor 360 drops from the current value 430 to zero as shown by the waveform 463.

At time $t_{12}$, the current 363 that flows from the auxiliary winding 318 to the capacitor 362 without going through the transistor 360 is equal to zero as shown by the waveform 463. Also, at time $t_{12}$, the voltage drop from the terminal 394 to the terminal 396 of the capacitor 362 is determines as follows:

$$V_{362} = \frac{N_{s3}}{N_{s1}} \times V_{out} \qquad \text{(Equation 2)}$$

where $V_{362}$ represents the voltage drop from the terminal 394 to the terminal 396 of the capacitor 362, and $V_{out}$ represents the output voltage 392. Also, $N_{s1}$ represents the number of turns for the secondary winding 314, and $N_{s3}$ represents the number of turns for the auxiliary winding 318.

From time $t_{12}$ to time $t_{13}$, the drive voltage 351 remains at the logic low level, and the transistor 350 remains turned off as shown by the waveform 451. Also, from time $t_{12}$ to time $t_{13}$, the primary winding 312 undergoes the demagnetization process as shown by the waveform 410, and the current 313 remains equal to zero as shown by the waveform 413. Additionally, from time $t_{12}$ to time $t_{13}$, the drive voltage 335 remains at the logic low level, and the transistor 360 remains turned off as shown by the waveform 435. Moreover, from time $t_{12}$ to time $t_{13}$, the current 363 remains equal to zero as shown by the waveform 463.

At time $t_{13}$, the demagnetization process of the primary winding 312 ends as shown by the waveform 410. Also, at time $t_{13}$, the drive voltage 351 remains at the logic low level, and the transistor 350 remains turned off as shown by the waveform 451. Additionally, at time $t_{13}$, the drive voltage 335 remains at the logic low level, and the transistor 360 remains turned off as shown by the waveform 435. Moreover, at time $t_{13}$, the current 313 remains equal to zero as shown by the waveform 413, and the current 363 remains equal to zero as shown by the waveform 463.

From time $t_{13}$ to time $t_{14}$, the parasitic capacitor 352 and the primary winding 312 undergo a resonance process, and during the resonance process, the voltage drop from the drain terminal 354 to the source terminal 358 of the transistor 350 drops to a voltage value 444 as shown by the waveform 410. Also, from time $t_{13}$ to time $t_{14}$, the drive voltage 351 remains at the logic low level, and the transistor 350 remains turned off as shown by the waveform 451. Additionally, from time $t_{13}$ to time $t_{14}$, the drive voltage 335 remains at the logic low level, and the transistor 360 remains turned off as shown by the waveform 435. Moreover, from time $t_{13}$ to time $t_{14}$, the current 313 remains equal to zero as shown by the waveform 413, and the current 363 remains equal to zero as shown by the waveform 463.

At time $t_{14}$, the drive voltage 335 changes from the logic low level to the logic high level, and the transistor 360 becomes turned on as shown by the waveform 435. Also, at time $t_{14}$, the current 363 starts flowing from the capacitor 362 to the transistor 360 through the auxiliary winding 318, and the capacitor 362 is discharged by the current 363.

From time $t_{14}$ to time $t_{15}$, the drive voltage 335 remains at the logic high level, and the transistor 360 remains turned on as shown by the waveform 435. For example, the transistor 360 remains turned on for a time duration $T_{on}$, which is equal to time $t_{15}$ minus time 114. As an example, the length of the time duration $T_{on}$ is determined by the on-time controller 370 based at least in part on the voltage 315. Also, from time $t_{14}$ to time $t_{15}$, the current 363 flows from the capacitor 362 to the transistor 360 through the auxiliary winding 318, and the current 363 decreases from zero to a negative current value 432 as shown by the waveform 463. Additionally, from time $t_{14}$ to time $t_{15}$, the drive voltage 351 remains at the logic low level, and the transistor 350 remains turned off as shown by the waveform 451. Moreover, from time $t_{14}$ to time $t_{15}$, the current 313 remains equal to zero as shown by the waveform 413. Also, from time $t_{14}$ to time $t_{15}$, the voltage drop from the drain terminal 354 to the source terminal 358 of the transistor 350 is clamped at a voltage value 442 as shown by the waveform 410. For example, the voltage 442 is determined as follows:

$$V_{442} = V_{bulk} + \frac{N_{s1}}{N_p} \times V_{out} \qquad \text{(Equation 3)}$$

where $V_{442}$ represents the voltage value 442. Additionally, $V_{bulk}$ represents the voltage 315, and $V_{out}$ represents the output voltage 392. Also, $N_{s1}$ represents the number of turns for the secondary winding 314, and $N_p$ represents the number of turns for the primary winding 312.

At time $t_{15}$, the drive voltage 335 changes from the logic high level to the logic low level, and the transistor 360 becomes turned off as shown by the waveform 435. Also, at time $t_{15}$, the current 363 that flows from the capacitor 362 to the transistor 360 through the auxiliary winding 318 increases from the negative current value 432 to zero as shown by the waveform 463. Additionally, at time $t_{15}$, the current 313 that flows from the transistor 350 to the primary winding 312 decreases from zero to a negative current value 422 as shown by the waveform 413. Moreover, at time $t_{15}$, the drive voltage 351 remains at the logic low level, and the transistor 350 remains turned off as shown by the waveform 451.

From time $t_{15}$ to time $t_{16}$, the drive voltage 335 remains at the logic low level, and the transistor 360 remains turned off as shown by the waveform 435. Also, from time $t_{15}$ to time $t_{16}$, the drive voltage 351 remains at the logic low level, and the transistor 350 remains turned off as shown by the waveform 451. For example, from time $t_{15}$ to time $t_{16}$, both the transistors 350 and 360 remain turned off for a time duration $T_{dead}$, which is equal to time $t_{16}$ minus time $t_{15}$. Additionally, from time $t_{15}$ to time $t_{16}$, the current 313 that flows from the transistor 350 to the primary winding 312 increases from the negative current value 422 to zero as shown by the waveform 413. Moreover, from time $t_{15}$ to time $t_{16}$, the current 363 remains equal to zero as shown by the waveform 463, and the parasitic capacitor 352 and the primary winding 312 undergo a resonance process as shown by the waveform 410. As an example, the time duration from time $t_{15}$ to time $t_{16}$ has a predetermined length (e.g., 400 ns).

At time $t_{16}$, the drive voltage 351 changes from the logic low level to the logic high level, and the transistor 350 becomes turned on as shown by the waveform 451. Also, at time $t_{16}$, the current 313 remains equal to zero as shown by the waveform 413, and the current 363 remains equal to zero as shown by the waveform 463. Additionally, at time $t_{16}$, immediately before the transistor 350 becomes tuned on, the voltage drop from the drain terminal 354 to the source terminal 358 of the transistor 350 is equal to a voltage value 440 as shown by the waveform 410. For example, the voltage value 440 is smaller than the voltage value 444. As an example, the voltage value 440 is approximately equal to zero volts. Moreover, at time $t_{16}$, the drive voltage 335 remains at the logic low level, and the transistor 360 remains turned off as shown by the waveform 435.

Hence it is highly desirable to improve the technique for switch-mode power converters.

3. BRIEF SUMMARY OF THE INVENTION

Certain embodiments of the present invention are directed to circuits. More particularly, some embodiments of the invention provide controllers and methods for detecting and adjusting voltage drops related to transistors. Merely by way of example, some embodiments of the invention have been applied to quasi-resonant switch-mode power converters. But it would be recognized that the invention has a much broader range of applicability.

According to certain embodiments, a controller for a power converter includes: a first gate driver configured to output a first drive signal to a first transistor related to a primary winding, the first transistor including a drain terminal and a source terminal, the primary winding being configured to receive an input voltage, the primary being coupled to a first auxiliary winding and a second auxiliary winding; one or more voltage detectors configured to generate a first detection signal and a second detection signal based at least in part on a current signal related to the first auxiliary winding; a time controller configured to receive the first detection signal and the second detection signal and generate a control signal based at least in part on the first detection signal and the second detection signal; and a second gate driver configured to receive the control signal, generate a second drive signal based at least in part on the control signal, and output the second drive signal to a second transistor related to the second auxiliary winding; wherein the one or more voltage detectors are further configured to: at a first time when the first drive signal is at a first logic level and the second drive signal is at a second logic level, detect the input voltage based at least in part on the current signal; and at a second time when the first drive signal is at the second logic level and the second drive signal is also at the second logic level, detect the input voltage minus a voltage drop from the drain terminal to the source terminal of the first transistor based at least in part on the current signal; wherein the one or more voltage detectors are further configured to: generate the first detection signal representing the input voltage at the first time; and generate the second detection signal representing the input voltage minus the voltage drop from the drain terminal to the source terminal of the first transistor at the second time; wherein the time controller is further configured to: determine the voltage drop from the drain terminal to the source terminal of the first transistor based at least in part on the first detection signal and the second detection; and determine a time duration when the second drive signal remains at the first logic level based at least in part on the determined voltage drop from the drain terminal to the source terminal of the first transistor.

According to some embodiments, a controller for a power converter includes: a first gate driver configured to output a first drive signal to a first transistor related to a primary winding, the first transistor including a drain terminal and a source terminal, the primary winding being configured to receive an input voltage, the primary being coupled to a first auxiliary winding and a second auxiliary winding; one or more voltage detectors configured to generate a first detection signal and a second detection signal based at least in part on a current signal related to the first auxiliary winding; a time controller configured to receive the first detection signal and the second detection signal and generate a control signal based at least in part on the first detection signal and the second detection signal; and a second gate driver configured to receive the control signal, generate a second drive signal based at least in part on the control signal, and output the second drive signal to a second transistor related to the second auxiliary winding; wherein the one or more voltage detectors are further configured to: at a first time when the first drive signal is at a first logic level and the second drive signal is at a second logic level, detect the input voltage based at least in part on the current signal; and at a second time when the first drive signal is at the second logic level and the second drive signal is also at the second logic level, detect the input voltage minus a voltage drop from the drain terminal to the source terminal of the first transistor based at least in part on the current signal; wherein the one or more voltage detectors are further configured to: generate the first detection signal representing the input voltage at the first time; and generate the second detection signal representing the input voltage minus the voltage drop from the drain terminal to the source terminal of the first transistor at the second time; wherein the time controller is further configured to: determine the voltage drop from the drain terminal to the source terminal of the first transistor based at least in part on the first detection signal and the second detection; if the determined voltage drop from the drain terminal to the source terminal of the first transistor is larger than a first threshold, increase a time duration when the second drive signal remains at the first logic level; and if the determined voltage drop from the drain terminal to the source terminal of the first transistor is smaller than a second threshold, decrease the time duration when the second drive signal remains at the first logic level; wherein the first threshold is larger than the second threshold.

According to certain embodiments, a method for a power converter includes: outputting a first drive signal to a first transistor related to a primary winding, the first transistor including a drain terminal and a source terminal, the primary winding being configured to receive an input voltage, the primary being coupled to a first auxiliary winding and a second auxiliary winding; detecting the input voltage based at least in part on a current signal related to the first auxiliary winding at a first time when the first drive signal is at a first logic level and the second drive signal is at a second logic level; detecting the input voltage minus a voltage drop from the drain terminal to the source terminal of the first transistor based at least in part on the current signal at a second time when the first drive signal is at the second logic level and the second drive signal is also at the second logic level; generating the first detection signal representing the input voltage at the first time; generating the second detection signal representing the input voltage minus the voltage drop from the drain terminal to the source terminal of the first transistor at the second time; receiving the first detection signal and the second detection signal; determining the voltage drop from the drain terminal to the source terminal of the first transistor based at least in part on the first detection signal and the second detection; determining a time duration when the second drive signal remains at the first logic level based at least in part on the determined voltage drop from the drain terminal to the source terminal of the first transistor; generating a control signal based at least in part on the determined time duration; receiving the control signal; generating a second drive signal based at least in part on the control signal; and outputting the second drive signal to a second transistor related to the second auxiliary winding.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

Certain embodiments of the present invention are directed to circuits. More particularly, some embodiments of the invention provide controllers and methods for detecting and adjusting voltage drops related to transistors. Merely by way of example, some embodiments of the invention have been applied to quasi-resonant switch-mode power converters. But it would be recognized that the invention has a much broader range of applicability.

Figure 1:
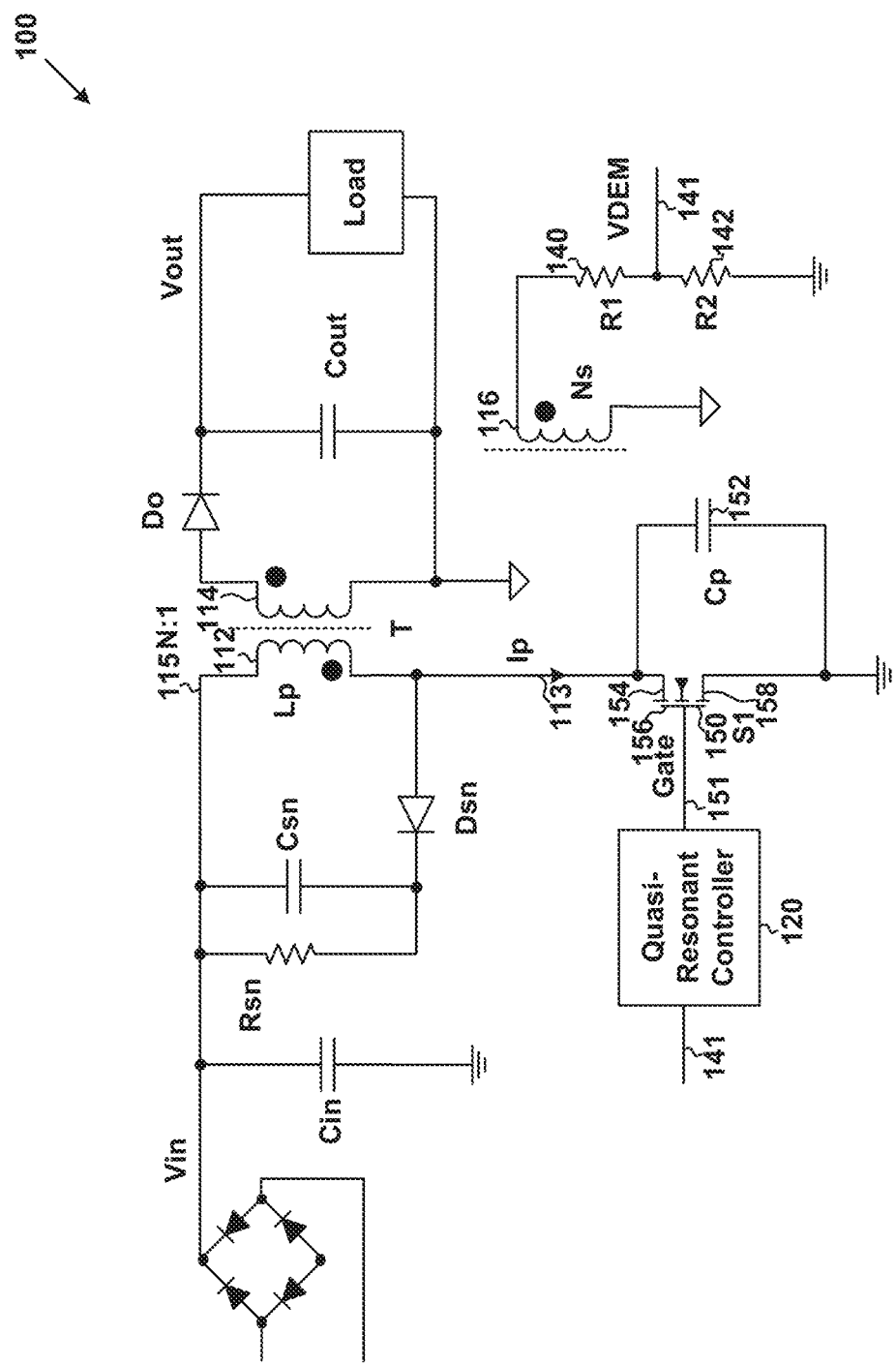
FIG. 1 is a simplified diagram showing a conventional fly-back quasi-resonant switch-mode power converter.
Figure 2:
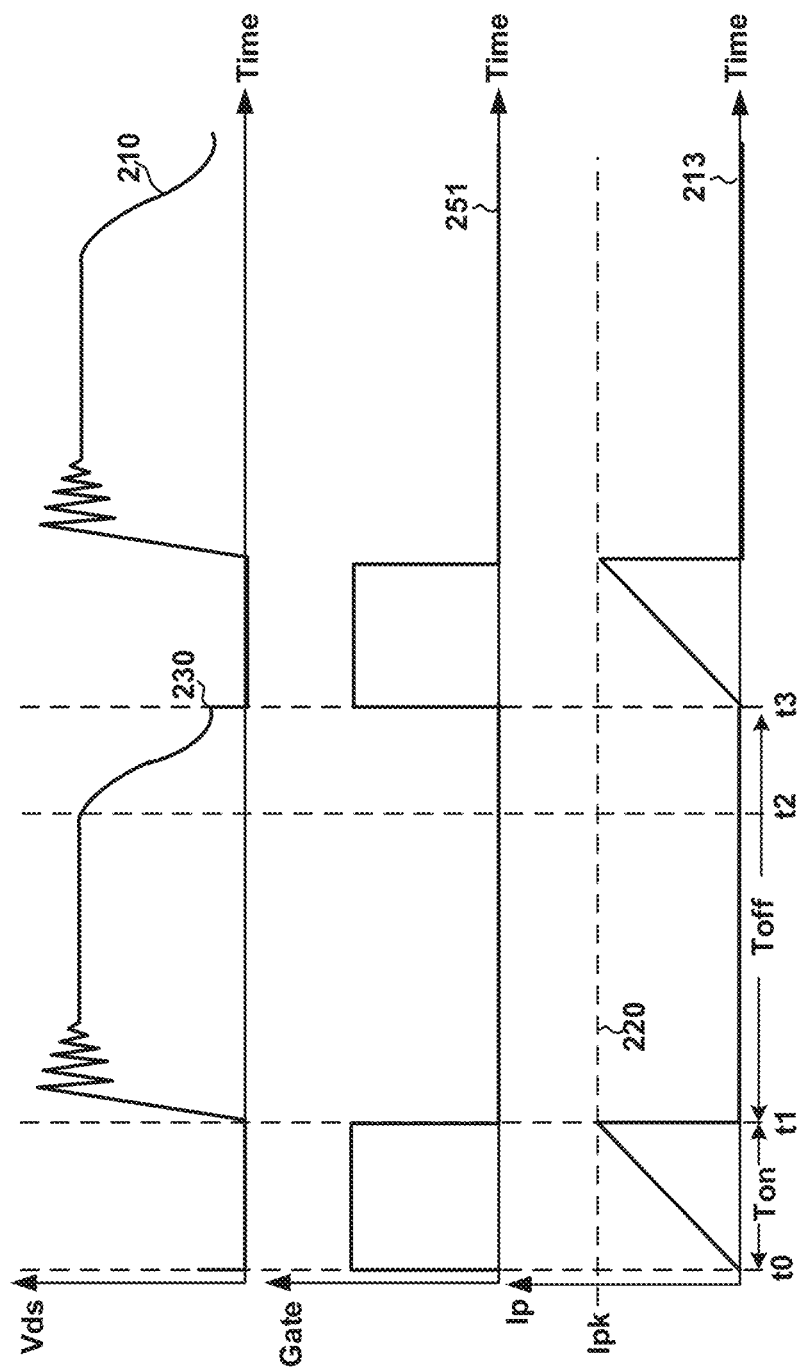
FIG. 2 shows simplified timing diagrams for the conventional fly-back quasi-resonant switch-mode power converter as shown in FIG. 1.
Figure 3:
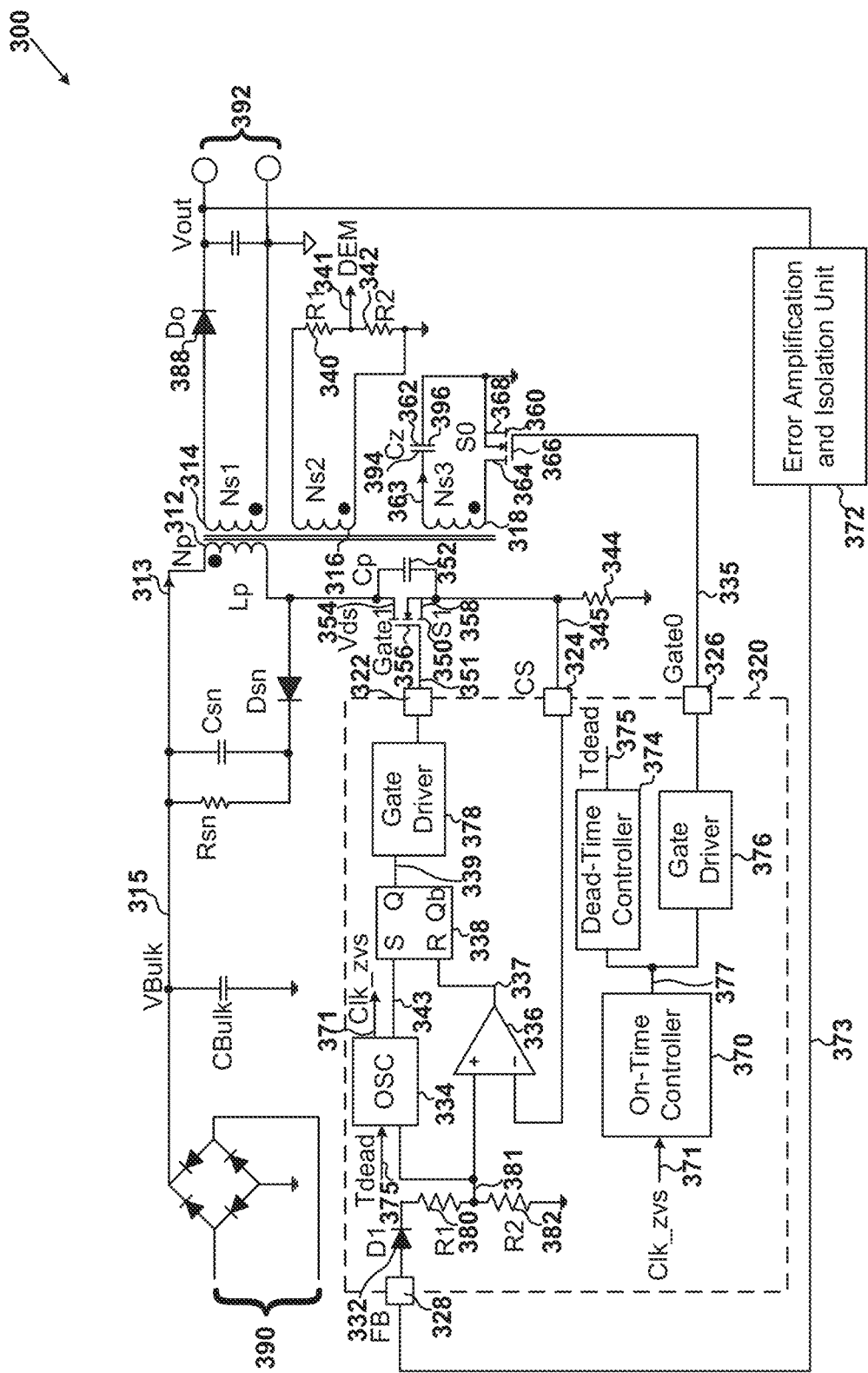
FIG. 3 is a simplified diagram showing a conventional quasi-resonant switch-mode power converter with zero-voltage switching.
Figure 4:
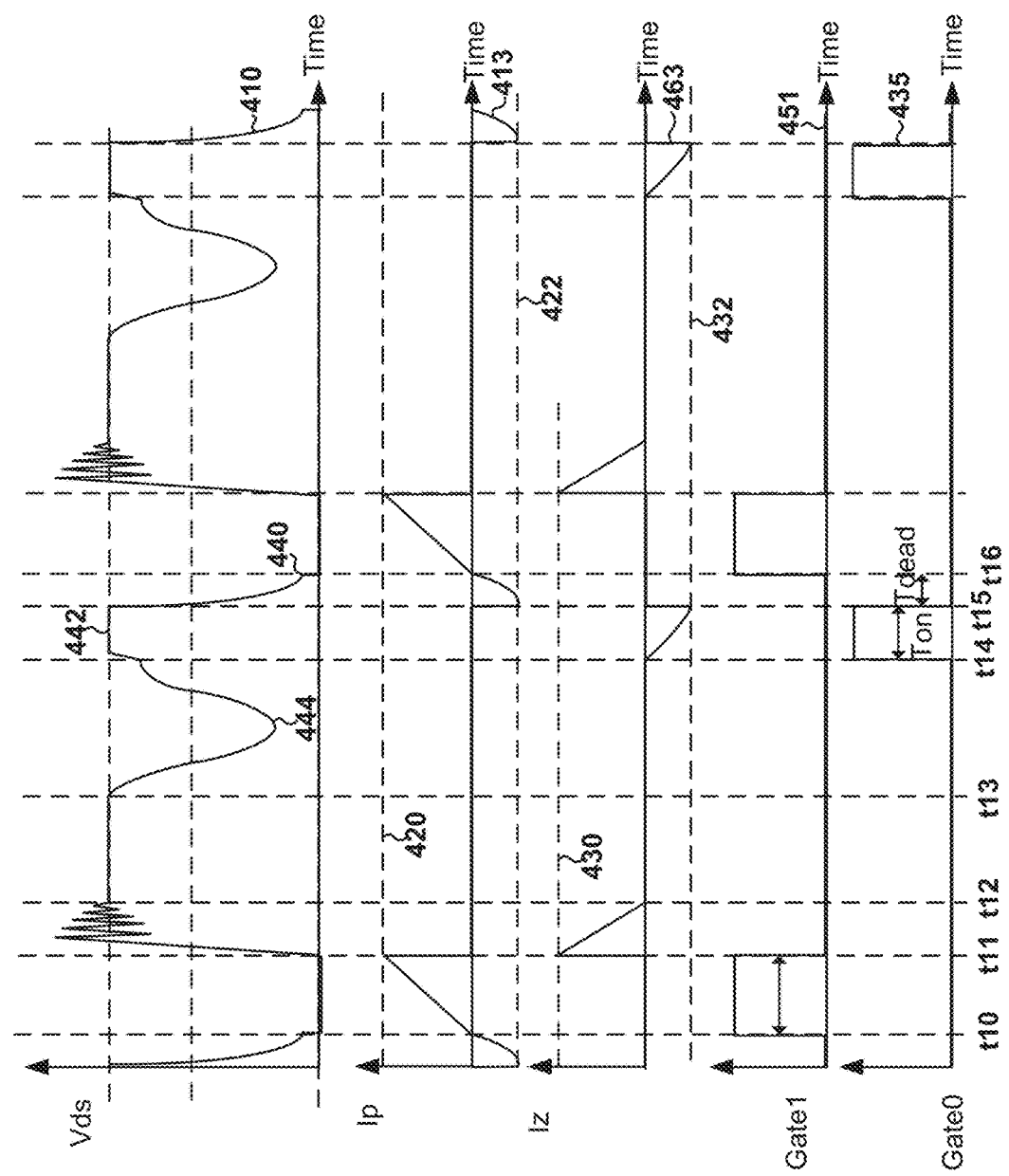
FIG. 4 shows simplified timing diagrams for the conventional fly-back quasi-resonant switch-mode power converter as shown in FIG. 3.

As shown in FIG. 3 and FIG. 4, the length of the time duration $T_{on}$ when the transistor 360 remains turned on and the magnitude of the voltage drop from the terminal 394 to the terminal 396 of the capacitor 362 at time $t_{12}$ according to Equation 2 determine the demagnetization energy of the auxiliary winding 318 according to some embodiments. In certain examples, the higher the demagnetization energy of the auxiliary winding 318, the lower the voltage value 440 for the voltage drop from the drain terminal 354 to the source terminal 358 of the transistor 350, which can further reduce the switching loss. In some examples, if a high-voltage power transistor is used as the transistor 350, when the voltage drop from the drain terminal 354 to the source terminal 358 of the transistor 350 is very low, the capacitance of the parasitic capacitor 352 increases nonlinearly. For example, if the capacitance of the parasitic capacitor 352 is large, the switching loss of the quasi-resonant switch-mode power converter 300 is not small even when the voltage drop from the drain terminal 354 to the source terminal 358 of the transistor 350 is very low. As an example, the nonlinear change of the capacitance of the parasitic capacitor 352 causes quick changes in current and/or voltage, thus worsening the electromagnetic interference (EMI) performance of the quasi-resonant switch-mode power converter 300.

Figure 5:
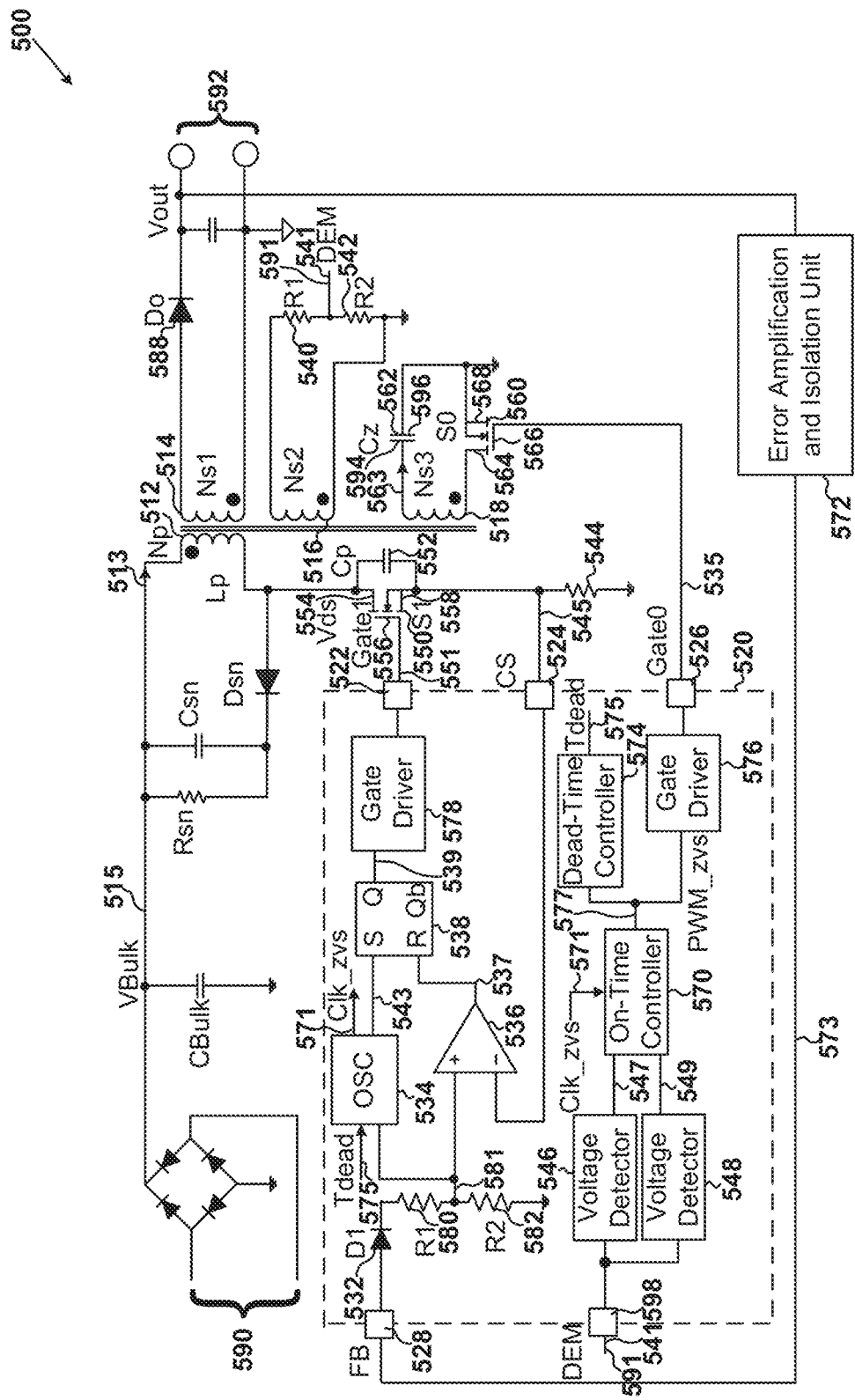
FIG. 5 is a simplified diagram showing a quasi-resonant switch-mode power converter according to certain embodiments of the present invention.

FIG. 5 is a simplified diagram showing a quasi-resonant switch-mode power converter according to certain embodiments of the present invention. This diagram is merely an example, which should not unduly limit the scope of the claims. One of ordinary skill in the art would recognize many variations, alternatives, and modifications. The quasi-resonant switch-mode power converter 500 includes a primary winding 512, a secondary winding 514, auxiliary windings 516 and 518, a controller chip 520, resistors 540, 542 and 544, transistors 550 and 560, a capacitor 562, an on-time controller 570, an error amplification and isolation unit 572, a diode 588, and voltage detectors 546 and 548. For example, the controller chip 520 includes resistors 580 and 582, a diode 532, an oscillator 534, a comparator 536, a flip flop 538, a dead-time controller 574, gate drivers 576 and 578. As an example, the controller chip 520 also includes terminals 522, 524, 526, 528, and 598 (e.g., pins). In some examples, the transistor 550 includes a parasitic capacitor 552. In certain examples, the primary winding 512, the secondary winding 514, and the auxiliary windings 516 and 518 are coupled to each other as parts of a transformer. In some examples, the quasi-resonant switch-mode power converter 500 is a flyback switch-mode power converter. Although the above has been shown using a selected group of components for the quasi-resonant switch-mode power converter, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

In certain embodiments, the transistor 550 includes a drain terminal 554, a gate terminal 556, and a source terminal 558, and the transistor 560 includes a drain terminal 564, a gate terminal 566, and a source terminal 568. In certain examples, the gate driver 578 of the controller chip 520 generates a drive voltage 551, and the gate driver 576 of the controller chip 520 generates a drive voltage 535. For example, the drive voltage 551 is received by the gate terminal 556 of the transistor 550, and the drive voltage 535 is received by the gate terminal 566 of the transistor 560. As an example, if the drive voltage 551 is at the logic high level, the transistor 550 is turned on, and if the drive voltage 551 is at the logic low level, the transistor 550 is turned off. For example, if the drive voltage 535 is at the logic high level, the transistor 560 is turned on, and if the drive voltage 535 is at the logic low level, the transistor 560 is turned off. In some examples, a current 541 (e.g., a current signal) is generated to flow out of the voltage detector 546 and/or the voltage detector 548 through the terminal 598 and then flows from the resistor 540 to the auxiliary winding 516 without going through the resistor 542. For example, one terminal of the resistor 540 and one terminal of the resistor 542 are connected to each other and are both biased to a voltage 591.

As an example, the error amplification and isolation unit 572 generates a feedback signal 573, which is received by the diode 532.

In some embodiments, the quasi-resonant switch-mode power converter 500 receives an AC input voltage 590 and generates an output voltage 592 according to certain embodiments. For example, a current 513 flows through the primary winding 512. As an example, a current 563 flows through the auxiliary winding 518. In certain examples, the primary winding 512 receives a voltage 515. In some examples, the capacitor 562 includes terminals 594 and 596.

As shown in FIG. 5, the current 541 flows out of the voltage detector 546 and/or the voltage detector 548 according to certain embodiments. In some examples, the current 541 flows out of the voltage detector 546, and when the transistor 550 is turned on and the transistor 560 is turned off, the voltage detector 546 detects the voltage 515 based at least in part on the current 541. For example, the voltage detector 546 generates a detection signal 547 that represents the detected magnitude of the voltage 515. As an example, the voltage detector 546 uses a sampling signal 593 to indicate a time when the transistor 550 is turned on and the transistor 560 is turned off. In certain examples, the current 541 flows out of the voltage detector 548, and when the transistor 550 is turned off and the transistor 560 is also turned off, the voltage detector 548 detects, based at least in part on the current 541, a voltage difference that is equal to the voltage 515 minus the voltage drop from the drain terminal 554 to the source terminal 558 of the transistor 550. For example, the voltage drop from the drain terminal 554 to the source terminal 558 of the transistor 550 is equal to the voltage at the drain terminal 554 minus the voltage at the source terminal 558. In some examples, the voltage detector 548 generates a detection signal 549 that represents the detected magnitude of the voltage difference that is equal to the voltage 515 minus the voltage drop from the drain terminal 554 to the source terminal 558 of the transistor 550. As an example, the voltage detector 548 uses a sampling signal 595 to indicate a time when the transistor 550 is turned off and the transistor 560 is also turned off.

According to some embodiments, the on-time controller 570 receives the detection signal 547, the detection signal 549, and a signal 571 and generates a control signal 577 based at least in part on the signals 547, 549 and 571. In some examples, if the signal 571 changes from a logic low level to a logic high level, the control signal 577 also changes from the logic low level to the logic high level in order to turn on the transistor 560. For example, the on-time controller 570 uses the detection signals 547 and 549 to determine the magnitude of the voltage drop from the drain terminal 554 to the source terminal 558 of the transistor 550. As an example, the on-time controller 570 (e.g., a time controller) uses the determined magnitude of the voltage drop from the drain terminal 554 to the source terminal 558 of the transistor 550 to determine the length of the time duration when the control signal 577 remains at the logic high level. In certain examples, the time duration when the control signal 577 remains at the logic high level is equal to the time duration when the drive voltage 535 remains at the logic high level. As an example, if the drive voltage 535 is at the logic high level, the transistor 560 is turned on. In some examples, the determined length of the time duration when the control signal 577 remains at the logic high level indicates the length of the time duration when the transistor 560 remains turned on.

In certain embodiments, the control signal 577 is received by the dead-time controller 574 and the gate driver 576. In some examples, the gate driver 576 generates the drive voltage 535 to turn on and/or turn off the transistor 560 based at least in part on the control signal 577. In certain examples, the dead-time controller 574 receives the control signal 577 and generates a dead-time signal 575 based at least in part on the control signal 577. For example, the dead-time signal 575 represents a delay from the time when the drive voltage 535 changes from a logic high level to a logic low level to the time when the drive voltage 551 changes from the logic low level to the logic high level (e.g., a delay from the time when transistor 560 becomes tuned off to the time when the transistor 550 becomes turned on). As an example, the dead-time signal 575 is received by the oscillator 534, which also receives a voltage 581 that is generated by the resistors 580 and 582.

In some embodiments, the resistor 580 is connected to the diode 532 and the resistor 582, and the resistors 580 and 582 output the voltage 581 to the oscillator 534 and the comparator 536. For example, the comparator 536 also receives a voltage 545 that is generates by the resistor 544 connected to the source terminal 558 of the transistor 550. As an example, in response, the comparator 536 generates a comparison signal 537, which is received by the flip flop 538.

In certain embodiments, the oscillator 534 receives the dead-time signal 575 and the voltage 581 and generates the signal 571 and a signal 543 based at least in part on the dead-time signal 575 and the voltage 581. For example, the signal 543 is received by the flip flop 538, which also receives the comparison signal 537 from the comparator 536 and generates a signal 539 based at least in part on the signal 535 and the comparison signal 537. The signal 539 is received by the gate driver 578, which in response generates the drive voltage 551 to turn on and/or turn off the transistor 550.

Figure 6:
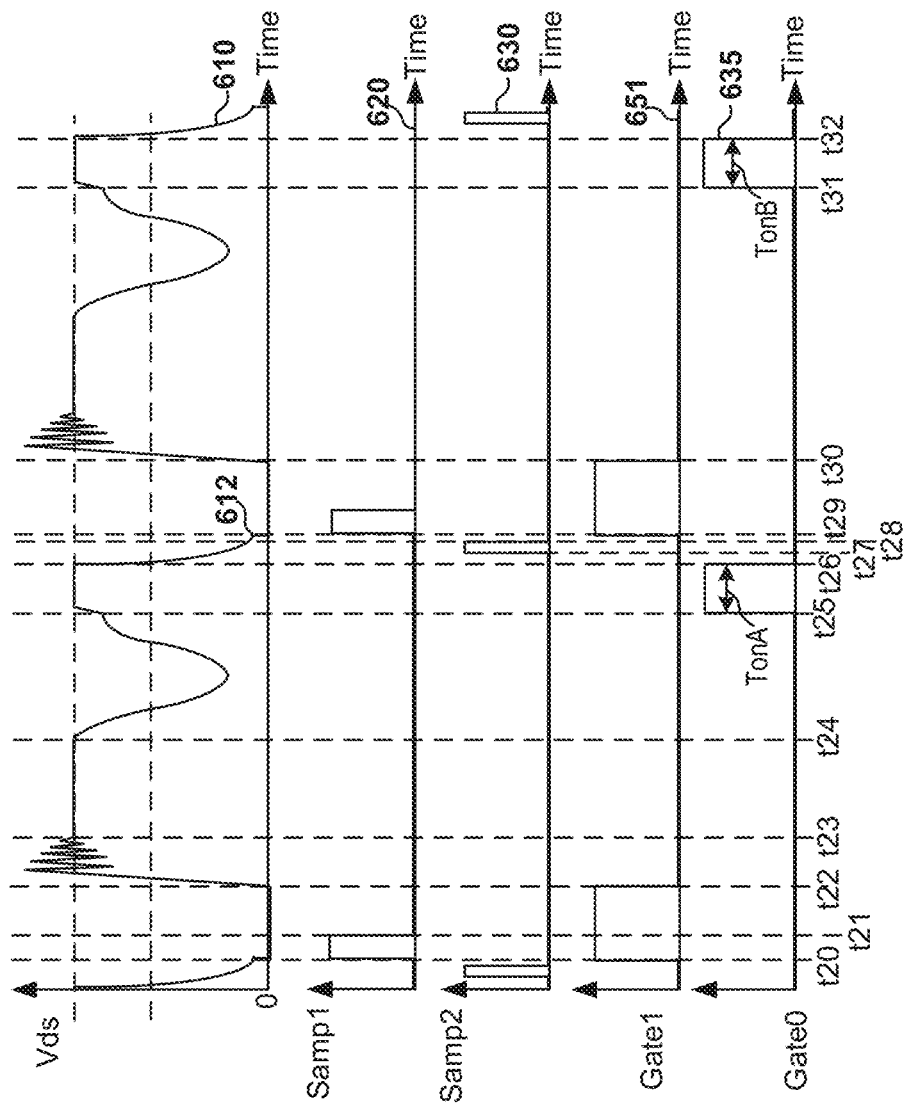
FIG. 6 shows simplified timing diagrams for the quasi-resonant switch-mode power converter as shown in FIG. 5 according to some embodiments of the present invention.

FIG. 6 shows simplified timing diagrams for the quasi-resonant switch-mode power converter 500 as shown in FIG. 5 according to some embodiments of the present invention. These diagrams are merely examples, which should not unduly limit the scope of the claims. One of ordinary skill in the art would recognize many variations, alternatives, and modifications. The waveform 610 represents the voltage drop from the drain terminal 554 to the source terminal 558 of the transistor 550 as a function of time, the waveform 620 represents the sampling signal 593 as a function of time, the waveform 630 represents the sampling signal 595 as a function of time, the waveform 651 represents the drive voltage 551 as a function of time, and the waveform 635 represents the drive voltage 535 as a function of time.

From time $t_{20}$ to time $t_{21}$, the drive voltage 551 remains at a logic high level, and the transistor 550 remains turned on as shown by the waveform 651 according to some embodiments. For example, from time $t_{20}$ to time $t_{21}$, the drive voltage 535 remains at a logic low level, and the transistor 560 remains turned off as shown by the waveform 635. In some examples, from time $t_{20}$ to time $t_{21}$, the sampling signal 593 remains at the logic high level as shown by the waveform 620, and the sampling signal 595 remains at the logic low level as shown by the waveform 630.

At time $t_{21}$, the sampling signal 593 changes from the logic high level to the logic low level as shown by the waveform 620 according to certain embodiments. For example, at time $t_{21}$, the drive voltage 551 is at the logic high level, and the transistor 550 is turned on as shown by the waveform 651. As an example, at time $t_{21}$, the drive voltage 535 is at the logic low level, and the transistor 560 is turned off as shown by the waveform 635. For example, at time $t_{21}$, the sampling signal 595 is at the logic low level as shown by the waveform 630.

In some examples, in response to the sampling signal 593 changing from the logic high level to the logic low level, at time $t_{21}$, the voltage detector 546 detects the current 541 to represent the voltage 515. In certain examples, at time $t_{21}$, the current 541 represents the voltage 515 as follows:

$$I_{541\_t21} = -\frac{N_{s2}}{N_p} \times V_{515\_t21} \times \frac{1}{R_1} \quad \text{(Equation 4)}$$

where $I_{541\_t21}$ represents the current 541 at time $t_{21}$, and $V_{515\_t21}$ represents the voltage 515 at time $t_{21}$. Additionally, $N_{s2}$ represents the number of turns of the auxiliary winding 516, and $N_p$ represents the number of turns of the primary winding 512. Also, $R_1$ represents the resistance of the resistor 540. For example, as shown by Equation 4, the current 541 at time $t_{21}$ (e.g., $I_{541\_t21}$) has a negative value, indicating that the current 541 at time $t_{21}$ flows from the resistor 540 to the auxiliary winding 516 without going through the resistor 542.

From time $t_{21}$ to time $t_{22}$, the sampling signal 593 remains at the logic low level as shown by the waveform 620 according to some embodiments. For example, from time $t_{21}$ to time $t_{22}$, the drive voltage 551 remains at the logic high level, and the transistor 550 remains turned on as shown by the waveform 651. As an example, from time $t_{21}$ to time $t_{22}$, the drive voltage 535 remains at the logic low level, and the transistor 560 remains turned off as shown by the waveform 635. In some examples, from time $t_{21}$ to time $t_{22}$, the sampling signal 595 remains at the logic low level as shown by the waveform 630.

At time $t_{22}$, the drive voltage 551 changes from the logic high level to the logic low level, and the transistor 550 becomes turned off as shown by the waveform 651 according to certain embodiments. For example, at time $t_{22}$, the drive voltage 535 is at the logic low level, and the transistor 560 is turned off as shown by the waveform 635. In some examples, at time $t_{22}$, the sampling signal 593 is at the logic low level as shown by the waveform 620, and the sampling signal 595 is also at the logic low level as shown by the waveform 630. In certain examples, at time $t_{22}$, the primary winding 512 starts undergoing a demagnetization process as shown by the waveform 610.

From time $t_{22}$ to time $t_{24}$, the drive voltage 551 remains at the logic low level, and the transistor 550 remains turned off as shown by the waveform 651 according to some embodiments. For example, from time $t_{22}$ to time $t_{24}$, the drive voltage 535 remains at the logic low level, and the transistor 560 remains turned off as shown by the waveform 635. In certain examples, from time $t_{22}$ to time $t_{24}$, the sampling signal 593 remains at the logic low level as shown by the waveform 620, and the sampling signal 595 also remains at the logic low level as shown by the waveform 630. In some examples, from time $t_{22}$ to time $t_{24}$, the primary winding 512 undergoes the demagnetization process as shown by the waveform 610.

At time $t_{24}$, the demagnetization process of the primary winding 512 ends as shown by the waveform 610 according to certain embodiments. For example, at time $t_{24}$, the drive voltage 551 is at the logic low level, and the transistor 550 is turned off as shown by the waveform 651. As an example, at time $t_{24}$, the drive voltage 535 is at the logic low level, and the transistor 560 is turned off as shown by the waveform 635. In certain examples, at time $t_{24}$, the sampling signal 593 is at the logic low level as shown by the waveform 620, and the sampling signal 595 also is at the logic low level as shown by the waveform 630.

From time $t_{24}$ to time $t_{25}$, the parasitic capacitor 552 and the primary winding 512 undergo a resonance process as shown by the waveform 610 according to some embodiments. For example, from time $t_{24}$ to time $t_{25}$, the drive voltage 551 remains at the logic low level, and the transistor 550 remains turned off as shown by the waveform 651. As an example, from time $t_{24}$ to time $t_{25}$, the drive voltage 535 remains at the logic low level, and the transistor 560 remains turned off as shown by the waveform 635. In certain examples, from time $t_{24}$ to time $t_{25}$, the sampling signal 593 remains at the logic low level as shown by the waveform 620, and the sampling signal 595 also remains at the logic low level as shown by the waveform 630.

At time $t_{25}$, the drive voltage 535 changes from the logic low level to the logic high level, and the transistor 560 becomes turned on as shown by the waveform 635 according to certain embodiments. For example, at time $t_{25}$, the drive voltage 551 is at the logic low level, and the transistor 550 is turned off as shown by the waveform 651. As an example, at time $t_{25}$, the sampling signal 593 is at the logic low level as shown by the waveform 620, and the sampling signal 595 is also at the logic low level as shown by the waveform 630.

From time $t_{25}$ to time $t_{26}$, the drive voltage 535 remains at the logic high level, and the transistor 560 remains turned on as shown by the waveform 635 according to some embodiments. For example, the transistor 560 remains turned on for a time duration $T_{onA}$, which is equal to time $t_{26}$ minus time $t_{25}$. In certain examples, from time $t_{25}$ to time $t_{26}$, the drive voltage 551 remains at the logic low level, and the transistor 550 remains turned off as shown by the waveform 651. In some examples, from time $t_{25}$ to time $t_{26}$, the sampling signal 593 remains at the logic low level as shown by the waveform 620, and the sampling signal 595 also remains at the logic low level as shown by the waveform 630.

At time $t_{26}$, the drive voltage 535 changes from the logic high level to the logic low level, and the transistor 560 becomes turned off as shown by the waveform 635 according to certain embodiments. For example, at time $t_{26}$, the drive voltage 551 is at the logic low level, and the transistor 550 is turned off as shown by the waveform 651. As an example, at time $t_{26}$, the sampling signal 593 is at the logic low level as shown by the waveform 620, and the sampling signal 595 is also at the logic low level as shown by the waveform 630.

From time $t_{26}$ to time $t_{27}$, the drive voltage 535 remains at the logic low level, and the transistor 560 remains turned off as shown by the waveform 635 according to some embodiments. For example, from time $t_{26}$ to time $t_{27}$, the drive voltage 551 remains at the logic low level, and the transistor 550 remains turned off as shown by the waveform 651. As an example, from time $t_{26}$ to time $t_{27}$, the sampling signal 593 remains at the logic low level as shown by the waveform 620, and the sampling signal 595 also remains at the logic low level as shown by the waveform 630.

At time $t_{27}$, the sampling signal 595 changes from the logic low level to the logic high level as shown by the waveform 630 according to certain embodiments. For example, at time $t_{27}$, the drive voltage 535 is at the logic low level, and the transistor 560 is turned off as shown by the waveform 635. As an example, at time $t_{27}$, the drive voltage 551 is at the logic low level, and the transistor 550 is turned off as shown by the waveform 651. In some examples, at time $t_{27}$, the sampling signal 593 is at the logic low level as shown by the waveform 620.

From time $t_{27}$ to time $t_{28}$, the sampling signal 595 remains at the logic high level as shown by the waveform 630 according to some embodiments. For example, from time $t_{27}$ to time $t_{28}$, the drive voltage 535 remains at the logic low level, and the transistor 560 remains turned off as shown by the waveform 635. As an example, from time $t_{27}$ to time $t_{28}$, the drive voltage 551 remains at the logic low level, and the transistor 550 remains turned off as shown by the waveform 651. In certain examples, from time $t_{27}$ to time $t_{28}$, the sampling signal 593 remains at the logic low level as shown by the waveform 620.

At time $t_{28}$, the sampling signal 595 changes from the logic high level to the logic low level as shown by the waveform 630 according to some embodiments. For example, at time $t_{28}$, the drive voltage 535 is at the logic low level, and the transistor 560 is turned off as shown by the waveform 635. As an example, at time $t_{28}$, the drive voltage 551 is at the logic low level, and the transistor 550 is turned off as shown by the waveform 651. In certain examples, at time $t_{28}$, the sampling signal 593 is at the logic low level as shown by the waveform 620.

In some examples, in response to the sampling signal 595 changing from the logic high level to the logic low level, at time $t_{28}$, the voltage detector 548 detects the current 541 to represent the voltage difference that is equal to the voltage 515 minus the voltage drop from the drain terminal 554 to the source terminal 558 of the transistor 550. In certain examples, at time $t_{28}$, the current 541 represents the voltage difference as follows:

$$I_{541\_t28} = -\frac{N_{s2}}{N_p} \times (V_{515\_t28} - V_{ds\_t28}) \times \frac{1}{R_1} \qquad \text{(Equation 5)}$$

where $I_{541\_t28}$ represents the current 541 at time $t_{28}$, and $V_{515\_t28}$ represents the voltage 515 at time $t_{28}$. Additionally, Vds_$t_{28}$ represents the voltage drop from the drain terminal 554 to the source terminal 558 of the transistor 550 at time $t_{28}$. Moreover, $N_{s2}$ represents the number of turns of the auxiliary winding 516, and $N_p$ represents the number of turns of the primary winding 512. Also, $R_1$ represents the resistance of the resistor 540. For example, as shown by Equation 5, the current 541 at time $t_{28}$ (e.g., $I_{541\_t28}$) has a negative value, indicating that the current 541 at time $t_{28}$ flows from the resistor 540 to the auxiliary winding 516 without going through the resistor 542.

In certain embodiments, the voltage 515 at time $t_{21}$ (e.g., $V_{515\_t21}$) is approximately equal to the voltage 515 at time $t_{28}$ (e.g., $V_{515\_t28}$), and the voltage drop from the drain terminal 554 to the source terminal 558 of the transistor 550 at time $t_{28}$ is determined as follows:

$$V_{ds\_t28} = -\frac{N_p}{N_{s2}} \times (I_{541\_t21} - I_{541\_t28}) \times R_1 \qquad \text{(Equation 6)}$$

where Vds_$t_{28}$ represents the voltage drop from the drain terminal 554 to the source terminal 558 of the transistor 550 at time $t_{28}$. Additionally, $I_{541\_t28}$ represents the current 541 at time $t_{28}$, and $I_{541\_t21}$ represents the current 541 at time $t_{21}$. Moreover, $N_{s2}$ represents the number of turns of the auxiliary winding 516, and $N_p$ represents the number of turns of the primary winding 512. Also, $R_1$ represents the resistance of the resistor 540.

In some embodiments, the on-time controller 570 receives the detection signal 547 that represents the current 541 at time $t_{21}$ (e.g., $I_{541\_t21}$) and also receives the detection signal 549 that represents the current 541 at time $t_{28}$ (e.g., $I_{541\_t28}$). In certain examples, the on-time controller 570 uses the detection signal 547 and the detection signal 549 to determine the current 541 at time $t_{28}$ (e.g., $V_{541\_t28}$) minus the current 541 at time $t_{21}$ (e.g., $V_{541\_t21}$) in order to determine the voltage drop from the drain terminal 554 to the source terminal 558 of the transistor 550 at time $t_{28}$ (e.g., $V_{ds\_t28}$) according to Equation 6.

At time $t_{29}$, the drive voltage 551 changes from the logic low level to the logic high level, and the transistor 550 becomes turned on as shown by the waveform 651 according to certain embodiments. For example, time $t_{29}$ minus time $t_{28}$ is equal to a predetermined delay. In some examples, the voltage drop from the drain terminal 554 to the source terminal 558 of the transistor 550 at time $t_{28}$ (e.g., $V_{ds\_t28}$) is used to represent the voltage drop (e.g., $V_{ds\_t29}$) from the drain terminal 554 to the source terminal 558 of the transistor 550 immediately before the drive voltage 551 changes from the logic low level to the logic high level and the transistor 550 becomes turned on at time $t_{29}$. For example, the voltage drop (e.g., $V_{ds\_t29}$) from the drain terminal 554 to the source terminal 558 of the transistor 550 immediately before the drive voltage 551 changes from the logic low level to the logic high level and the transistor 550 becomes turned on at time $t_{29}$ is equal to a voltage value 612.

At time $t_{30}$, the drive voltage 551 changes from the logic high level to the logic low level, and the transistor 550 becomes turned off as shown by the waveform 651 according to certain embodiments. For example, at time $t_{30}$, the drive voltage 535 is at the logic low level, and the transistor 560 is turned off as shown by the waveform 635. In some examples, at time $t_{30}$, the sampling signal 593 is at the logic low level as shown by the waveform 620, and the sampling signal 595 is also at the logic low level as shown by the waveform 630. In certain examples, at time $t_{30}$, the primary winding 512 starts undergoing a demagnetization process as shown by the waveform 610.

From time $t_{31}$ to time $t_{32}$, the drive voltage 535 remains at the logic high level, and the transistor 560 remains turned on as shown by the waveform 635 according to some embodiments. For example, the transistor 560 remains turned on for a time duration $T_{onB}$, which is equal to time $t_{32}$ minus time $t_{31}$. In certain examples, from time $t_{31}$ to time $t_{32}$, the drive voltage 551 remains at the logic low level, and the transistor 550 remains turned off as shown by the waveform 651. In some examples, from time $t_{31}$ to time $t_{32}$, the sampling signal 593 remains at the logic low level as shown by the waveform 620, and the sampling signal 595 also remains at the logic low level as shown by the waveform 630.

According to certain embodiments, if the voltage drop from the drain terminal 554 to the source terminal 558 of the transistor 550 at time $t_{28}$ (e.g., Vds_$t_{28}$) is larger than a predetermined high voltage-drop threshold, the on-time controller 570 increases the time duration when the drive voltage 535 remains at the logic high level in order to reduce the voltage drop from the drain terminal 554 to the source terminal 558 of the transistor 550 immediately before the drive voltage 551 changes from the logic low level to the logic high level and the transistor 550 becomes turned on. For example, if the voltage drop from the drain terminal 554 to the source terminal 558 of the transistor 550 at time $t_{28}$ (e.g., Vds_$t_{28}$) is larger than the predetermined high voltage-drop threshold, the on-time controller 570 increases the time duration when the drive voltage 535 remains at the logic high level from the time duration $T_{onA}$ to the time duration $T_{onB}$, where the time duration $T_{onB}$ is larger than the time duration $T_{onA}$.

According to some embodiments, if the voltage drop from the drain terminal 554 to the source terminal 558 of the transistor 550 at time $t_{28}$ (e.g., Vds_$t_{28}$) is smaller than a predetermined low voltage-drop threshold, the on-time controller 570 decreases the time duration when the drive voltage 535 remains at the logic high level in order to increase the voltage drop from the drain terminal 554 to the source terminal 558 of the transistor 550 immediately before the drive voltage 551 changes from the logic low level to the logic high level and the transistor 550 becomes turned on. For example, the predetermined low voltage-drop threshold is smaller than the predetermined high voltage-drop threshold. As an example, if the voltage drop from the drain terminal 554 to the source terminal 558 of the transistor 550 at time $t_{28}$ (e.g., Vds_$t_{28}$) is smaller than the predetermined low voltage-drop threshold, the on-time controller 570 decreases the time duration when the drive voltage 535 remains at the logic high level from the time duration $T_{onA}$ to the time duration $T_{onB}$, where the time duration $T_{onB}$ is smaller than the time duration $T_{onA}$.

According to certain embodiments, if the voltage drop from the drain terminal 554 to the source terminal 558 of the transistor 550 at time $t_{28}$ (e.g., Vds_$t_{28}$) is smaller than the predetermined high voltage-drop threshold and larger than the predetermined low voltage-drop threshold, the on-time controller 570 does not change the time duration when the drive voltage 535 remains at the logic high level in order not to change the voltage drop from the drain terminal 554 to the source terminal 558 of the transistor 550 immediately before the drive voltage 551 changes from the logic low level to the logic high level and the transistor 550 becomes turned on. As an example, if the voltage drop from the drain terminal 554 to the source terminal 558 of the transistor 550 at time $t_{28}$ (e.g., Vds_$t_{28}$) is smaller than the predetermined high voltage-drop threshold and larger than the predetermined low voltage-drop threshold, the on-time controller 570 does not change the time duration when the drive voltage 535 remains at the logic high level, where the time duration $T_{onA}$ is equal to the time duration $T_{onB}$.

Figure 7A:
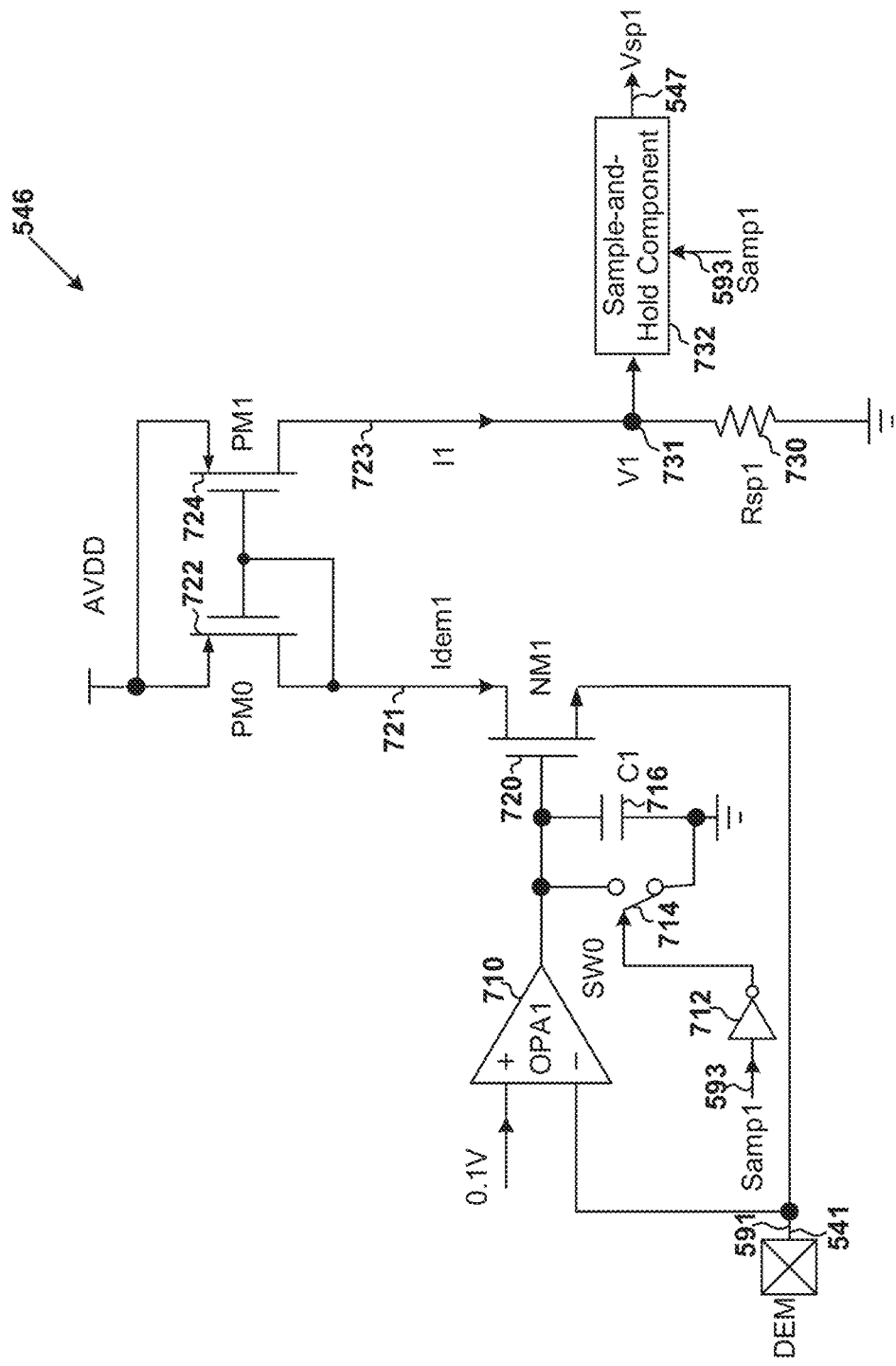
FIG. 7A is a simplified diagram showing the voltage detector as part of the quasi-resonant switch-mode power converter as shown in FIG. 5 according to certain embodiments of the present invention.

FIG. 7A is a simplified diagram showing the voltage detector 546 as part of the quasi-resonant switch-mode power converter 500 as shown in FIG. 5 according to certain embodiments of the present invention. This diagram is merely an example, which should not unduly limit the scope of the claims. One of ordinary skill in the art would recognize many variations, alternatives, and modifications. The voltage detector 546 includes an operational amplifier 710, a NOT gate 712, a switch 714, a capacitor 716, transistors 720, 722 and 724, a resistor 730, and a sample-and-hold component 732. Although the above has been shown using a selected group of components for the voltage detector 546, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 7A, the current 541 flows out of the voltage detector 546 (e.g., flows from the transistor 720 to the resistor 540) according to some embodiments. For example, the sampling signal 593 is received by the NOT gate 712 and the sample-and-hold component 732. As an example, the sample-and-hold component 732 generates the detection signal 547. In certain examples, the voltage 591 is clamped to a predetermined voltage. For example, a current 723 is obtained by mirroring a current 721, which is equal to the current 541 in magnitude. As an example, the current 723 is converted to a voltage 731 by the resistor 730. In some examples, the voltage 731 is sampled and held by the sample-and-hold component 732, which generates the detection signal 547. For example, the detection signal 547 is a voltage (e.g., $V_{sp1}$).

In certain embodiments, during a pulse of the sampling signal 593 (e.g., from time $t_{20}$ to time $t_{21}$), the voltage 591 is clamped to the predetermined voltage that is close to zero volts (e.g., 0.1 volts) by the operational amplifier 710, the capacitor 716, and/or the transistor 720. For example, the transistors 722 and 724 are parts of a current mirror, which mirrors the current 721 and generates the current 723. As an example, the current 723 is converted to the voltage 731 by the resistor 730. In some examples, in response to the falling edge of the sampling signal 593 (e.g., at time $t_{21}$), the voltage 731 is sampled and held by the sample-and-hold component 732, which generates the detection signal 547. For example, the detection signal 547 represents the detected magnitude of the voltage 515 at time $t_{21}$ (e.g., $V_{515\_t21}$).

In some embodiments, by detecting the current 721 that is equal to the current 541 in magnitude, the voltage detector 546 detects the voltage 515. In certain examples, the current 721 represents the voltage 515 as follows:

$$I_{721\_t21} = \frac{0.1\text{ V} + \frac{N_{s2}}{N_p} \times V_{515\_t21}}{R_1} + \frac{0.1\text{ V}}{R_2} \quad \text{(Equation 7A)}$$

where $I_{721\_t21}$ represents the current 721 at time $t_{21}$, and $V_{515\_t21}$ represents the voltage 515 at time $t_{21}$. Additionally, $N_{s2}$ represents the number of turns of the auxiliary winding 516, and $N_p$ represents the number of turns of the primary winding 512. Also, $R_1$ represents the resistance of the resistor 540, and $R_2$ represents the resistance of the resistor 542. In some examples, $$\frac{N_{s2}}{N_p} \times V_{515\_t21}$$

is much larger than 0.1 volts, and the current 721 is approximated as follows:

$$I_{721\_t21} \cong \frac{N_{s2}}{N_p} \times \frac{V_{515\_t21}}{R_1} \quad \text{(Equation 8A)}$$

where $I_{721\_t21}$ represents the current 721 at time $t_{21}$, and $V_{515\_t21}$ represents the voltage 515 at time $t_{21}$. Additionally, $N_{s2}$ represents the number of turns of the auxiliary winding 516, and $N_p$ represents the number of turns of the primary winding 512. Also, $R_1$ represents the resistance of the resistor 540. For example, according to Equation 8A, approximately, the current 721 at time $t_{21}$ (e.g., $I_{721\_t21}$) is directly proportional to the voltage 515 at time $t_{21}$ (e.g., $V_{515\_t21}$). As an example, the current 721 at time $t_{21}$ (e.g., $I_{721\_t21}$) is equal to the current 541 at time $t_{21}$ (e.g., $I_{541\_t21}$) in magnitude.

Figure 7B:
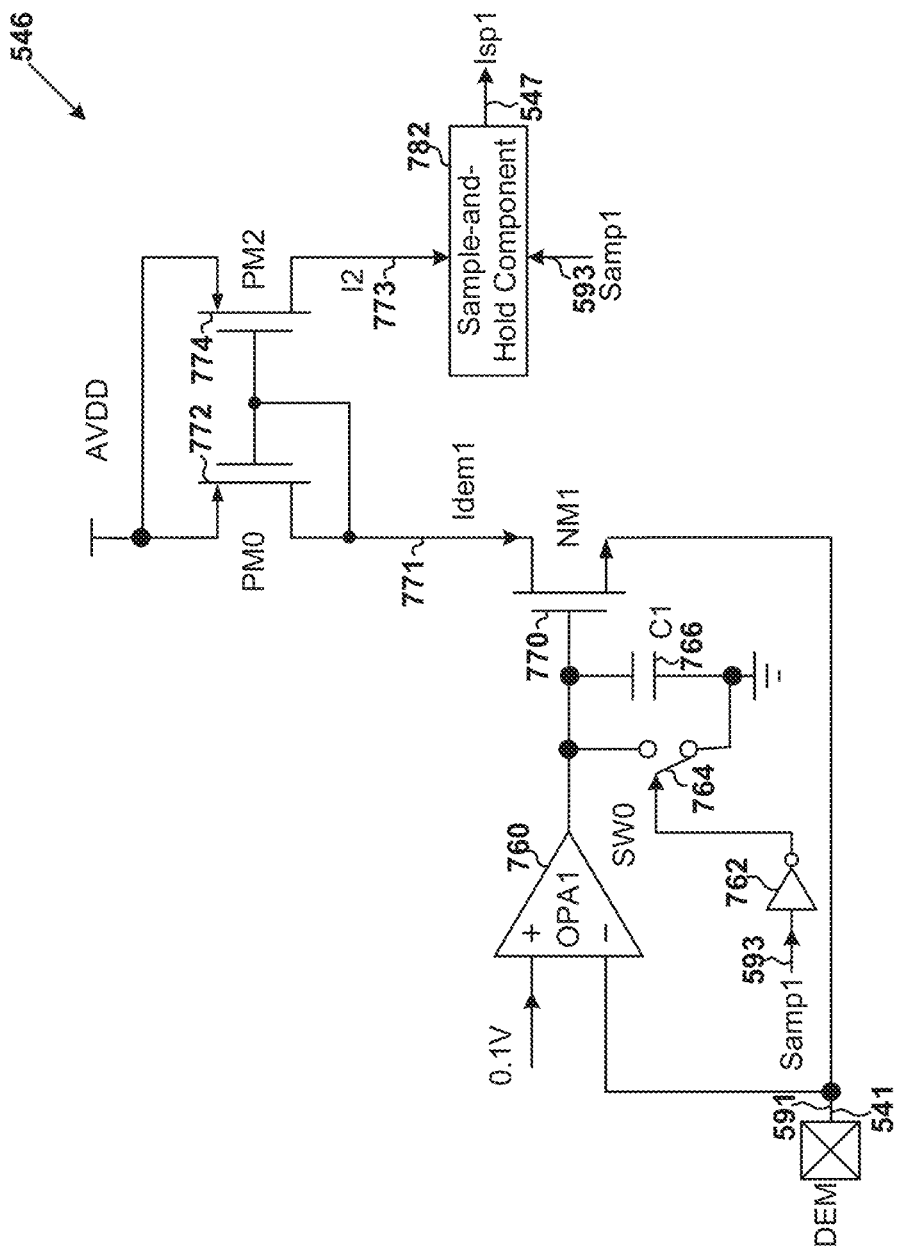
FIG. 7B is a simplified diagram showing the voltage detector as part of the quasi-resonant switch-mode power converter as shown in FIG. 5 according to some embodiments of the present invention.

FIG. 7B is a simplified diagram showing the voltage detector 546 as part of the quasi-resonant switch-mode power converter 500 as shown in FIG. 5 according to some embodiments of the present invention. This diagram is merely an example, which should not unduly limit the scope of the claims. One of ordinary skill in the art would recognize many variations, alternatives, and modifications. The voltage detector 546 includes an operational amplifier 760, a NOT gate 762, a switch 764, a capacitor 766, transistors 770, 772 and 774, and a sample-and-hold component 782. Although the above has been shown using a selected group of components for the voltage detector 546, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 7B, the current 541 flows out of the voltage detector 546 (e.g., flows from the transistor 770 to the resistor 540) according to some embodiments. For example, the sampling signal 593 is received by the NOT gate 762 and the sample-and-hold component 782. As an example, the sample-and-hold component 782 generates the detection signal 547. In certain examples, the voltage 591 is clamped to a predetermined voltage. For example, a current 773 is obtained by mirroring a current 771, which is equal to the current 541 in magnitude. As an example, the current 773 is sampled and held by the sample-and-hold component 782, which generates the detection signal 547. For example, the detection signal 547 is a current (e.g., $I_{sp1}$).

In certain embodiments, during a pulse of the sampling signal 593 (e.g., from time $t_{20}$ to time $t_{21}$), the voltage 591 is clamped to the predetermined voltage that is close to zero volts (e.g., 0.1 volts) by the operational amplifier 760, the capacitor 766, and/or the transistor 770. For example, the transistors 772 and 774 are parts of a current mirror, which mirrors the current 771 and generates the current 773. In some examples, in response to the falling edge of the sampling signal 593 (e.g., at time $t_{21}$), the current 773 is sampled and held by the sample-and-hold component 782, which generates the detection signal 547. For example, the detection signal 547 represents the detected magnitude of the voltage 515 at time $t_{21}$ (e.g., $V_{515\_t21}$).

In some embodiments, by detecting the current 771 that is equal to the current 541 in magnitude, the voltage detector 546 detects the voltage 515. In certain examples, the current 771 represents the voltage 515 as follows:

$$I_{771\_t21} = \frac{0.1\text{V} + \frac{N_{s2}}{N_p} \times V_{515\_t21}}{R_1} + \frac{0.1\text{V}}{R_2} \quad \text{(Equation 7B)}$$

where $I_{771\_t21}$ represents the current 771 at time $t_{21}$, and $V_{515\_t21}$ represents the voltage 515 at time $t_{21}$. Additionally, $N_{s2}$ represents the number of turns of the auxiliary winding 516, and $N_p$ represents the number of turns of the primary winding 512. Also, $R_1$ represents the resistance of the resistor 540, and $R_2$ represents the resistance of the resistor 542. In some examples, $$\frac{N_{s2}}{N_p} \times V_{515\_t21}$$

is much larger than 0.1 volts, and the current 771 is approximated as follows:

$$I_{771\_t21} \cong \frac{N_{s2}}{N_p} \times \frac{V_{515\_t21}}{R_1} \quad \text{(Equation 8B)}$$

where $I_{771\_t21}$ represents the current 771 at time $t_{21}$, and $V_{515\_t21}$ represents the voltage 515 at time $t_{21}$. Additionally, $N_{s2}$ represents the number of turns of the auxiliary winding 516, and $N_p$ represents the number of turns of the primary winding 512. Also, $R_1$ represents the resistance of the resistor 540. For example, according to Equation 8B, approximately, the current 771 at time $t_{21}$ (e.g., $I_{771\_t21}$) is directly proportional to the voltage 515 at time $t_{21}$ (e.g., $V_{515\_t21}$). As an example, the current 771 at time $t_{21}$ (e.g., $I_{771\_t21}$) is equal to the current 541 at time $t_{21}$ (e.g., $I_{541\_t21}$) in magnitude.

Figure 8A:
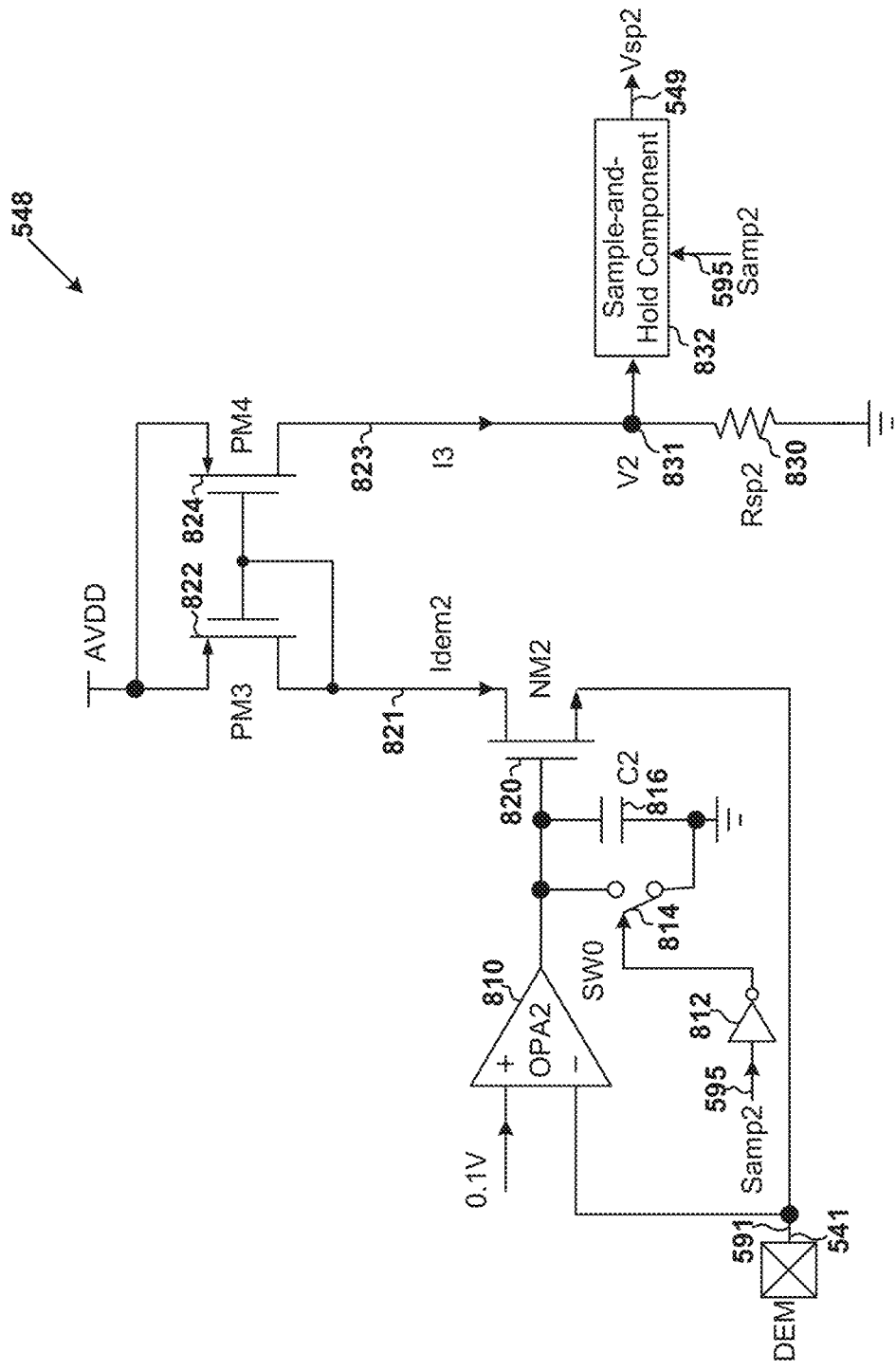
FIG. 8A is a simplified diagram showing the voltage detector as part of the quasi-resonant switch-mode power converter as shown in FIG. 5 according to certain embodiments of the present invention.

FIG. 8A is a simplified diagram showing the voltage detector 548 as part of the quasi-resonant switch-mode power converter 500 as shown in FIG. 5 according to certain embodiments of the present invention. This diagram is merely an example, which should not unduly limit the scope of the claims. One of ordinary skill in the art would recognize many variations, alternatives, and modifications. The voltage detector 548 includes an operational amplifier 810, a NOT gate 812, a switch 814, a capacitor 816, transistors 820, 822 and 824, a resistor 830, and a sample-and-hold component 832. Although the above has been shown using a selected group of components for the voltage detector 548, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 8A, the current 541 flows out of the voltage detector 548 (e.g., flows from the transistor 820 to the resistor 540) according to some embodiments. For example, the sampling signal 595 is received by the NOT gate 812 and the sample-and-hold component 832. As an example, the sample-and-hold component 832 generates the detection signal 549. In certain examples, the voltage 591 is clamped to a predetermined voltage. For example, a current 823 is obtained by mirroring a current 821, which is equal to the current 541 in magnitude. As an example, the current 823 is converted to a voltage 831 by the resistor 830. In some examples, the voltage 831 is sampled and held by the sample-and-hold component 832, which generates the detection signal 549. For example, the detection signal 549 is a voltage (e.g., $V_{sp2}$).

In certain embodiments, during a pulse of the sampling signal 595 (e.g., from time $t_{27}$ to time $t_{28}$), the voltage 591 is clamped to the predetermined voltage that is close to zero volts (e.g., 0.1 volts) by the operational amplifier 810, the capacitor 816, and/or the transistor 820. For example, the transistors 822 and 824 are parts of a current mirror, which mirrors the current 821 and generates the current 823. As an example, the current 823 is converted to the voltage 831 by the resistor 830. In some examples, in response to the falling edge of the sampling signal 595 (e.g., at time $t_{28}$), the voltage 831 is sampled and held by the sample-and-hold component 832, which generates the detection signal 549. For example, the detection signal 549 represents the voltage 515 at time $t_{28}$ (e.g., $V_{515\_t28}$) minus the voltage drop from the drain terminal 554 to the source terminal 558 of the transistor 550 at time $t_{28}$ (e.g., $V_{ds\_t28}$).

In some embodiments, by detecting the current 821 that is equal to the current 541 in magnitude, the voltage detector 548 detects the voltage 515 minus the voltage drop from the drain terminal 554 to the source terminal 558 of the transistor 550. In certain examples, the current 821 represents the voltage 515 minus the voltage drop as follows:

$$I_{821\_t28} = \frac{0.1V + \frac{N_{s2}}{N_p} \times (V_{515\_t28} - V_{ds\_t28})}{R_1} + \frac{0.1V}{R_2} \quad \text{(Equation 9A)}$$

where $I_{821\_t28}$ represents the current 821 at time $t_{28}$, and $V_{515\_t28}$ represents the voltage 515 at time $t_{28}$. Additionally, $V_{ds\_t28}$ represents the voltage drop from the drain terminal 554 to the source terminal 558 of the transistor 550 at time $t_{28}$. Moreover, $N_{s2}$ represents the number of turns of the auxiliary winding 516, and $N_p$ represents the number of turns of the primary winding 512. Also, $R_1$ represents the resistance of the resistor 540, and $R_2$ represents the resistance of the resistor 542. In some examples, $$\frac{N_{s2}}{N_p} \times (V_{515\_t28} - V_{ds\_t28})$$

is much larger than 0.1 volts, and the current 821 is approximated as follows:

$$I_{821\_t28} \cong \frac{N_{s2}}{N_p} \times \frac{V_{515\_t28} - V_{ds\_t28}}{R_1} \quad \text{(Equation 10A)}$$

where $I_{821\_t28}$ represents the current 821 at time $t_{28}$, and $V_{515\_t28}$ represents the voltage 515 at time $t_{28}$. Additionally, $V_{ds\_t28}$ represents the voltage drop from the drain terminal 554 to the source terminal 558 of the transistor 550 at time $t_{28}$. Moreover, $N_{s2}$ represents the number of turns of the auxiliary winding 516, and $N_p$ represents the number of turns of the primary winding 512. Also, $R_1$ represents the resistance of the resistor 540. For example, according to Equation 10A, approximately, the current 821 at time $t_{28}$ (e.g., $I_{821\_t28}$) is directly proportional to the voltage 515 at time $t_{28}$ (e.g., $V_{515\_t28}$) minus the voltage drop from the drain terminal 554 to the source terminal 558 of the transistor 550 at time $t_{28}$ (e.g., $V_{ds\_t28}$). As an example, the current 821 at time $t_{28}$ (e.g., $I_{821\_t28}$) is equal to the current 541 at time $t_{28}$ (e.g., $I_{541\_t28}$) in magnitude.

Figure 8B:
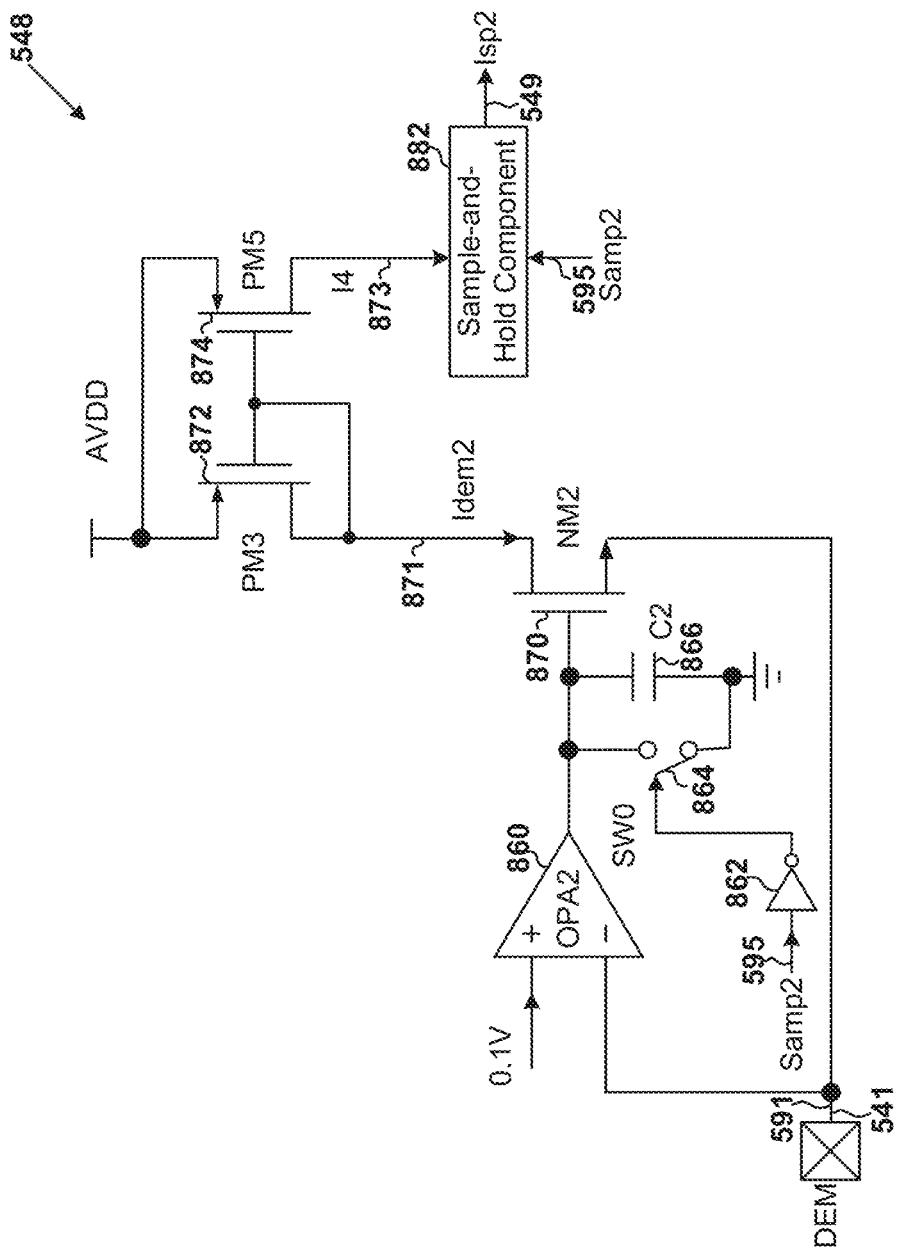
FIG. 8B is a simplified diagram showing the voltage detector as part of the quasi-resonant switch-mode power converter as shown in FIG. 5 according to some embodiments of the present invention.

FIG. 8B is a simplified diagram showing the voltage detector 548 as part of the quasi-resonant switch-mode power converter 500 as shown in FIG. 5 according to some embodiments of the present invention. This diagram is merely an example, which should not unduly limit the scope of the claims. One of ordinary skill in the art would recognize many variations, alternatives, and modifications. The voltage detector 546 includes an operational amplifier 860, a NOT gate 862, a switch 864, a capacitor 866, transistors 870, 872 and 874, and a sample-and-hold component 882. Although the above has been shown using a selected group of components for the voltage detector 548, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 8B, the current 541 flows out of the voltage detector 548 (e.g., flows from the transistor 870 to the resistor 540) according to some embodiments. For example, the sampling signal 595 is received by the NOT gate 862 and the sample-and-hold component 882. As an example, the sample-and-hold component 882 generates the detection signal 549. In certain examples, the voltage 591 is clamped to a predetermined voltage. For example, a current 873 is obtained by mirroring a current 871, which is equal to the current 541 in magnitude. As an example, the current 873 is sampled and held by the sample-and-hold component 882, which generates the detection signal 549. For example, the detection signal 549 is a current (e.g., $I_{sp2}$).

In certain embodiments, during a pulse of the sampling signal 595 (e.g., from time $t_{27}$ to time $t_{28}$), the voltage 591 is clamped to the predetermined voltage that is close to zero volts (e.g., 0.1 volts) by the operational amplifier 860, the capacitor 866, and/or the transistor 870. For example, the transistors 872 and 874 are parts of a current mirror, which mirrors the current 871 and generates the current 873. In some examples, in response to the falling edge of the sampling signal 593 (e.g., at time $t_{28}$), the current 873 is sampled and held by the sample-and-hold component 882, which generates the detection signal 549. For example, the detection signal 549 represents the voltage 515 at time $t_{28}$ (e.g., $V_{515\_t28}$) minus the voltage drop from the drain terminal 554 to the source terminal 558 of the transistor 550 at time $t_{28}$ (e.g., $V_{ds\_t28}$).

In some embodiments, by detecting the current 871 that is equal to the current 541 in magnitude, the voltage detector 546 detects the voltage 515 minus the voltage drop from the drain terminal 554 to the source terminal 558 of the transistor 550. In certain examples, the current 871 represents the voltage 515 minus the voltage drop as follows:

$$I_{871\_t28} = \frac{0.1V + \frac{N_{s2}}{N_p} \times (V_{515\_t28} - V_{ds\_t28})}{R_1} + \frac{0.1V}{R_2} \quad \text{(Equation 9B)}$$

where $I_{871\_t28}$ represents the current 871 at time $t_{28}$, and $V_{515\_t28}$ represents the voltage 515 at time $t_{28}$. Additionally, $V_{ds\_t28}$ represents the voltage drop from the drain terminal 554 to the source terminal 558 of the transistor 550 at time $t_{28}$. Additionally, $N_{s2}$ represents the number of turns of the auxiliary winding 516, and $N_p$ represents the number of turns of the primary winding 512. Also, $R_1$ represents the resistance of the resistor 540, and $R_2$ represents the resistance of the resistor 542. In some examples, $$\frac{N_{s2}}{N_p} \times (V_{515\_t28} - V_{ds\_t28})$$

is much larger than 0.1 volts, and the current 871 is approximated as follows:

$$I_{871\_t28} \cong \frac{N_{s2}}{N_p} \times \frac{V_{515\_t28} - V_{ds\_t28}}{R_1} \quad \text{(Equation 10B)}$$

where $I_{871\_t28}$ represents the current 871 at time $t_{28}$, and $V_{515\_t28}$ represents the voltage 515 at time $t_{28}$. Additionally, $V_{ds\_t28}$ represents the voltage drop from the drain terminal 554 to the source terminal 558 of the transistor 550 at time $t_{28}$. Moreover, $N_{s2}$ represents the number of turns of the auxiliary winding 516, and $N_p$ represents the number of turns of the primary winding 512. Also, $R_1$ represents the resistance of the resistor 540. For example, according to Equation 10B, approximately, the current 871 at time $t_{28}$ (e.g., $I_{871\_t28}$) is directly proportional to the voltage 515 at time $t_{28}$ (e.g., $V_{515\_t28}$) minus the voltage drop from the drain terminal 554 to the source terminal 558 of the transistor 550 at time $t_{28}$ (e.g., $V_{ds\_t28}$). As an example, the current 871 at time $t_{28}$ (e.g., $I_{871\_t28}$) is equal to the current 541 at time $t_{28}$ (e.g., $I_{541\_t28}$) in magnitude.

As mentioned above and further emphasized here, FIG. 5 is merely an example, which should not unduly limit the scope of the claims. One of ordinary skill in the art would recognize many variations, alternatives, and modifications. For example, the voltage detectors 546 and 548 are combined and implemented as a voltage detector 900 as shown in FIG. 9A and/or a voltage detector 950 as shown in FIG. 9B.

Figure 9A:
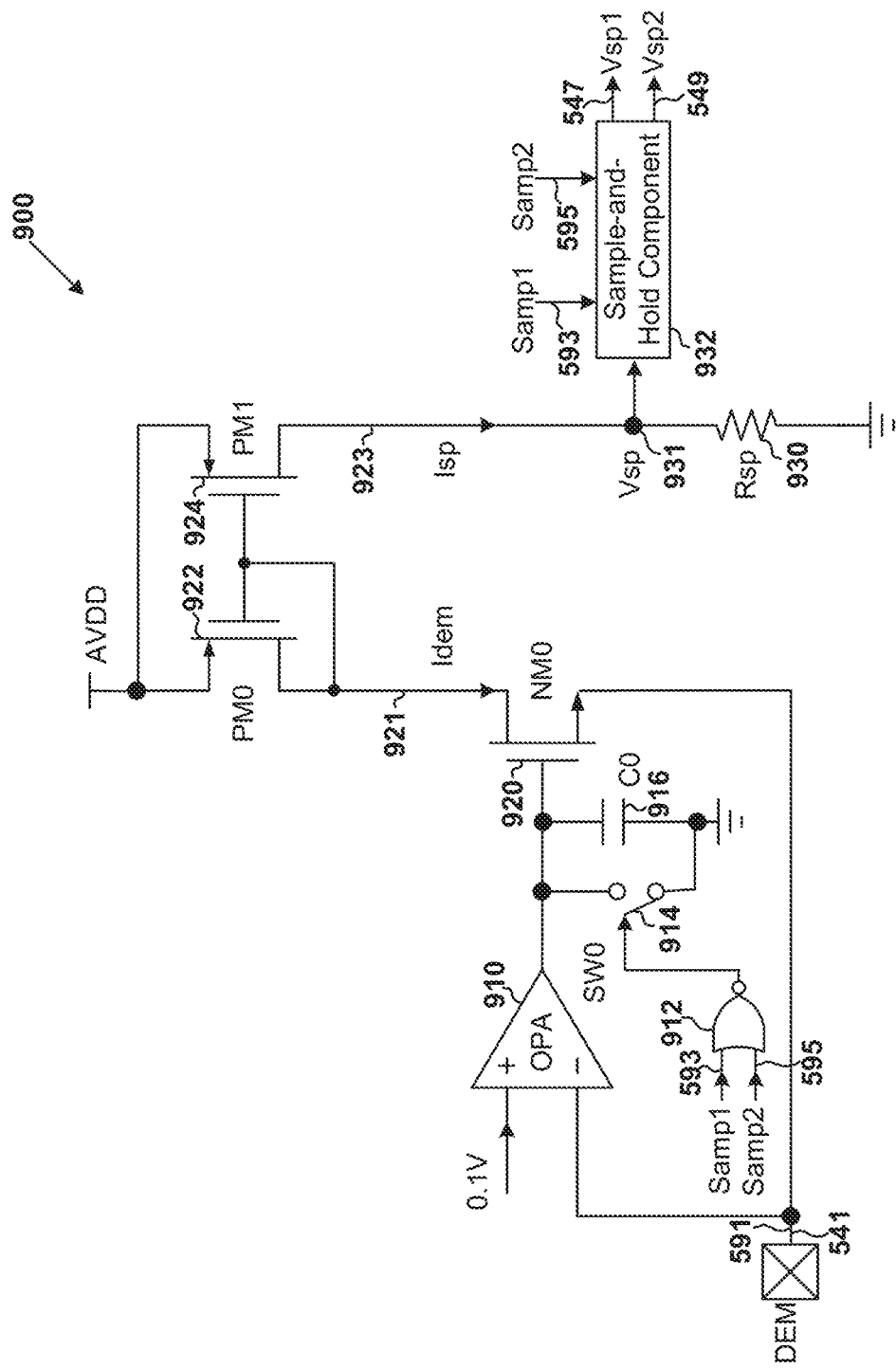
FIG. 9A is a simplified diagram showing a voltage detector that is a combination of two voltage detectors as parts of the quasi-resonant switch-mode power converter as shown in FIG. 5 according to certain embodiments of the present invention.
Figure 9B:
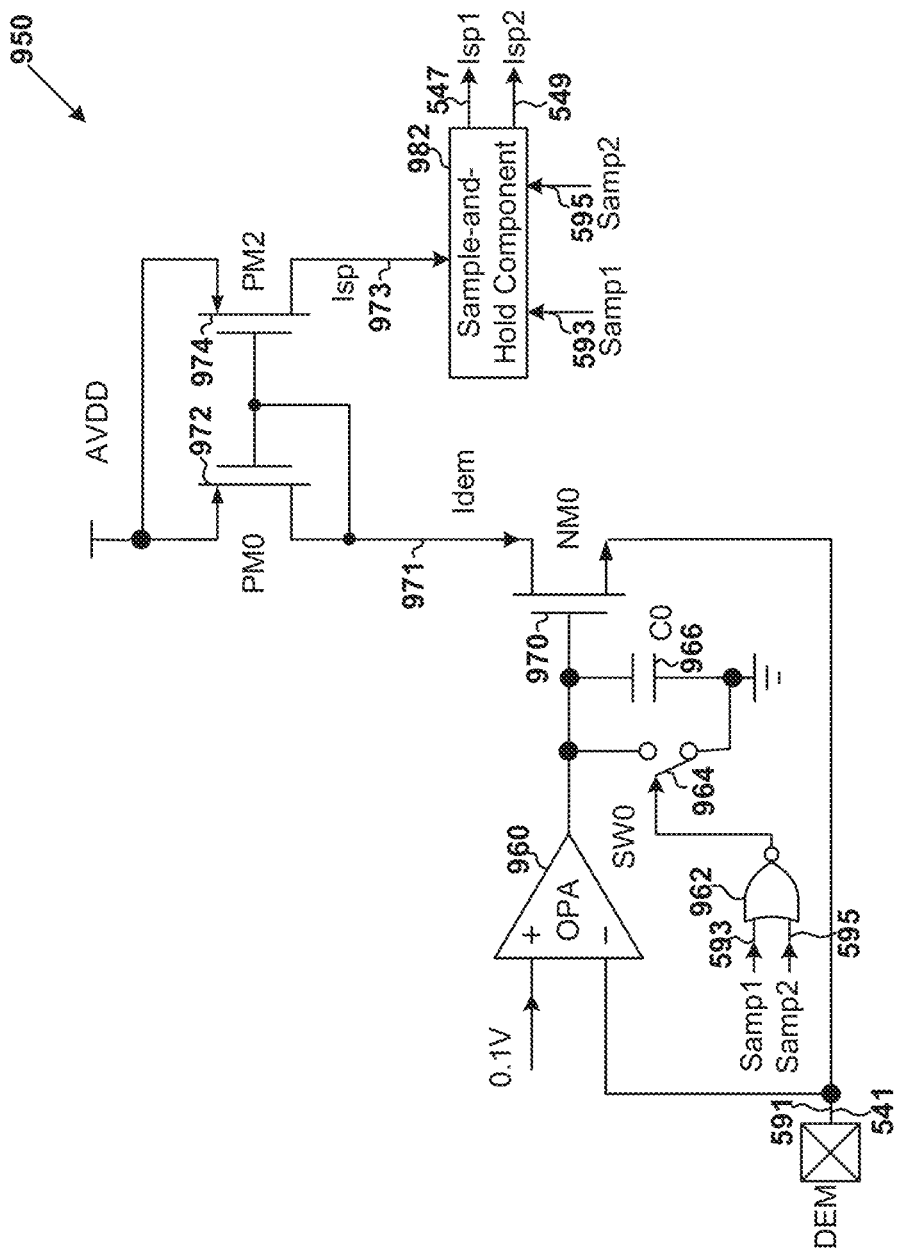
FIG. 9B is a simplified diagram showing a voltage detector that is a combination of two voltage detectors as parts of the quasi-resonant switch-mode power converter as shown in FIG. 5 according to certain embodiments of the present invention.

FIG. 9A is a simplified diagram showing a voltage detector that is a combination of both the voltage detectors 546 and 548 as parts of the quasi-resonant switch-mode power converter 500 as shown in FIG. 5 according to certain embodiments of the present invention. This diagram is merely an example, which should not unduly limit the scope of the claims. One of ordinary skill in the art would recognize many variations, alternatives, and modifications. The voltage detector 900 includes an operational amplifier 910, a NOR gate 912, a switch 914, a capacitor 916, transistors 920, 922 and 924, a resistor 930, and a sample-and-hold component 932. Although the above has been shown using a selected group of components for the voltage detector 900, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 9A, the current 541 flows out of the voltage detector 900 (e.g., flows from the transistor 920 to the resistor 540) according to some embodiments. For example, the sampling signals 593 and 595 are received by the NOR gate 912 and the sample-and-hold component 932. As an example, the sample-and-hold component 932 generates the detection signals 547 and 549. In certain examples, the voltage 591 is clamped to a predetermined voltage. For example, a current 923 is obtained by mirroring a current 921, which is equal to the current 541 in magnitude. As an example, the current 923 is converted to a voltage 931 by the resistor 930. In some examples, the voltage 931 is sampled and held by the sample-and-hold component 932, which generates the detection signals 547 and 549. For example, the detection signal 547 is a voltage (e.g., $V_{sp1}$), and the detection signal 549 is also a voltage (e.g., $V_{sp2}$).

In certain embodiments, during a pulse of the sampling signal 593 (e.g., from time $t_{20}$ to time $t_{21}$), the voltage 591 is clamped to the predetermined voltage that is close to zero volts (e.g., 0.1 volts) by the operational amplifier 910, the capacitor 916, and/or the transistor 920. For example, the transistors 922 and 924 are parts of a current mirror, which mirrors the current 921 and generates the current 923. As an example, the current 923 is converted to the voltage 931 by the resistor 930. In some examples, in response to the falling edge of the sampling signal 593 (e.g., at time $t_{21}$), the voltage 931 is sampled and held by the sample-and-hold component 932, which generates the detection signal 547. For example, the detection signal 547 represents the detected magnitude of the voltage 515 at time $t_{21}$ (e.g., $V_{515\_t21}$).

In some embodiments, during a pulse of the sampling signal 595 (e.g., from time $t_{27}$ to time $t_{28}$), the voltage 591 is clamped to the predetermined voltage that is close to zero volts (e.g., 0.1 volts) by the operational amplifier 910, the capacitor 916, and/or the transistor 920. For example, the transistors 922 and 924 are parts of the current mirror, which mirrors the current 921 and generates the current 923. As an example, the current 923 is converted to the voltage 931 by the resistor 930. In some examples, in response to the falling edge of the sampling signal 595 (e.g., at time $t_{28}$), the voltage 931 is sampled and held by the sample-and-hold component 932, which generates the detection signal 549. For example, the detection signal 549 represents the voltage 515 at time $t_{28}$ (e.g., $V_{515\_t28}$) minus the voltage drop from the drain terminal 554 to the source terminal 558 of the transistor 550 at time $t_{28}$ (e.g., $V_{ds\_t28}$).

FIG. 9B is a simplified diagram showing a voltage detector that is a combination of both the voltage detectors 546 and 548 as parts of the quasi-resonant switch-mode power converter 500 as shown in FIG. 5 according to certain embodiments of the present invention. This diagram is merely an example, which should not unduly limit the scope of the claims. One of ordinary skill in the art would recognize many variations, alternatives, and modifications. The voltage detector 950 includes an operational amplifier 960, a NOR gate 962, a switch 964, a capacitor 966, transistors 970, 972 and 974, and a sample-and-hold component 982. Although the above has been shown using a selected group of components for the voltage detector 950, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 9B, the current 541 flows out of the voltage detector 950 (e.g., flows from the transistor 970 to the resistor 540) according to some embodiments. For example, the sampling signals 593 and 595 are received by the NOR gate 962 and the sample-and-hold component 982. As an example, the sample-and-hold component 982 generates the detection signals 547 and 549. In certain examples, the voltage 591 is clamped to a predetermined voltage. For example, a current 973 is obtained by mirroring a current 971, which is equal to the current 541 in magnitude. As an example, the current 973 is sampled and held by the sample-and-hold component 982, which generates the detection signals 547 and 549. For example, the detection signal 547 is a current (e.g., $I_{sp1}$), and the detection signal 549 is also a current (e.g., $I_{sp2}$).

In certain embodiments, during a pulse of the sampling signal 593 (e.g., from time $t_{20}$ to time $t_{21}$), the voltage 591 is clamped to the predetermined voltage that is close to zero volts (e.g., 0.1 volts) by the operational amplifier 960, the capacitor 966, and/or the transistor 970. For example, the transistors 972 and 974 are parts of a current mirror, which mirrors the current 971 and generates the current 973. In some examples, in response to the falling edge of the sampling signal 593 (e.g., at time $t_{21}$), the current 973 is sampled and held by the sample-and-hold component 932, which generates the detection signal 547. For example, the detection signal 547 represents the detected magnitude of the voltage 515 at time $t_{21}$ (e.g., $V_{515\_t21}$).

In some embodiments, during a pulse of the sampling signal 595 (e.g., from time $t_{27}$ to time $t_{28}$), the voltage 591 is clamped to the predetermined voltage that is close to zero volts (e.g., 0.1 volts) by the operational amplifier 960, the capacitor 966, and/or the transistor 970. For example, the transistors 972 and 974 are parts of the current mirror, which mirrors the current 971 and generates the current 973. In some examples, in response to the falling edge of the sampling signal 595 (e.g., at time $t_{28}$), the current 973 is sampled and held by the sample-and-hold component 982, which generates the detection signal 549. For example, the detection signal 549 represents the voltage 515 at time $t_{28}$ (e.g., $V_{515\_t28}$) minus the voltage drop from the drain terminal 554 to the source terminal 558 of the transistor 550 at time $t_{28}$ (e.g., $V_{ds\_t28}$).

Figure 10:
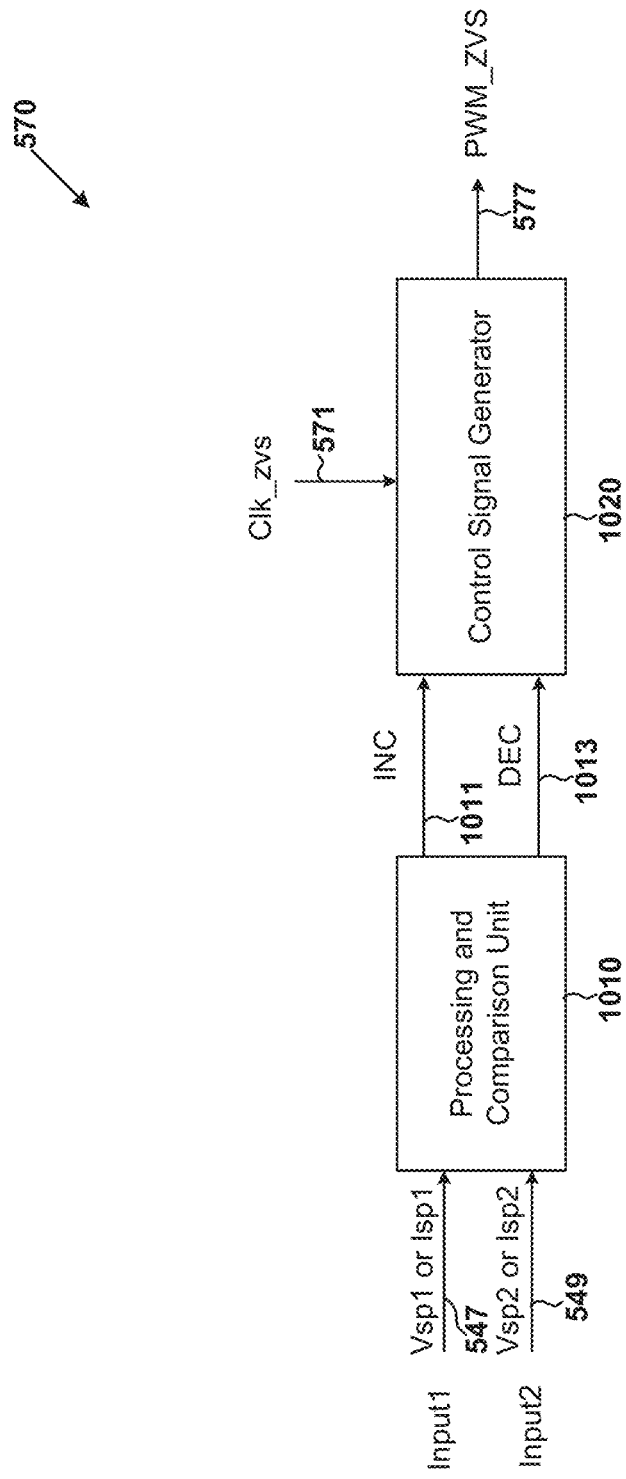
FIG. 10 is a simplified diagram showing the on-time controller as part of the quasi-resonant switch-mode power converter as shown in FIG. 5 according to certain embodiments of the present invention.

FIG. 10 is a simplified diagram showing the on-time controller 570 as part of the quasi-resonant switch-mode power converter 500 as shown in FIG. 5 according to certain embodiments of the present invention. This diagram is merely an example, which should not unduly limit the scope of the claims. One of ordinary skill in the art would recognize many variations, alternatives, and modifications. The on-time controller 570 includes a processing and comparison unit 1010 and a control signal generator 1020. Although the above has been shown using a selected group of components for the on-time controller 570, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 10, the processing and comparison unit 1010 receives the detection signals 547 and 549 and generates an increase signal 1011 and a decrease signal 1013 based at least in part on the detection signals 547 and 549 according to some embodiments. For example, the detection signal 547 is a voltage (e.g., $V_{sp1}$), and the detection signal 549 is also a voltage (e.g., $V_{sp2}$). As an example, the detection signal 547 is a current (e.g., $I_{sp1}$), and the detection signal 549 is also a current (e.g., $I_{sp2}$). In certain examples, the increase signal 1011 and the decrease signal 1013 are received by the control signal generator 1020, which also receives the signal 571. For example, in response to the increase signal 1011 and the decrease signal 1013, the control signal generator 1020 generates the control signal 577 based at least in part on the signal 571.

In certain embodiments, the processing and comparison unit 1010 receives the detection signals 547 and 549 and determines a difference between the detection signals 547 and 549 to represent the voltage drop from the drain terminal 554 to the source terminal 558 of the transistor 550 (e.g., according to Equation 6). For example, if the determined difference is larger than a predetermined high reference, the processing and comparison unit 1010 generates the increase signal 1011 (e.g., a comparison signal) at a logic high level and the decrease signal 1013 (e.g., a comparison signal) at a logic low level. As an example, if the determined difference is smaller than a predetermined low reference, the processing and comparison unit 1010 generates the increase signal 1011 (e.g., a comparison signal) at the logic low level and the decrease signal 1013 (e.g., a comparison signal) at the logic high level. For example, if the determined difference is larger than the predetermined low reference and smaller than the predetermined high reference, the processing and comparison unit 1010 generates the increase signal 1011 (e.g., a comparison signal) at the logic low level and the decrease signal 1013 (e.g., a comparison signal) also at the logic low level.

In some embodiments, the predetermined high reference is larger than the predetermined low reference. For example, the predetermined high reference corresponds to the predetermined high voltage-drop threshold. As an example, the predetermined low reference corresponds to the predetermined low voltage-drop threshold. In certain examples, if the voltage drop from the drain terminal 554 to the source terminal 558 of the transistor 550 (e.g., $Vds\_t_{28}$) is larger than the predetermined high voltage-drop threshold, the increase signal 1011 (e.g., a comparison signal) is at the logic high level and the decrease signal 1013 (e.g., a comparison signal) is at the logic low level. In some examples, if the voltage drop from the drain terminal 554 to the source terminal 558 of the transistor 550 (e.g., $Vds\_t_{28}$) is smaller than the predetermined low voltage-drop threshold, the increase signal 1011 (e.g., a comparison signal) is at the logic low level and the decrease signal 1013 (e.g., a comparison signal) is at the logic high level. In certain examples, if the voltage drop from the drain terminal 554 to the source terminal 558 of the transistor 550 (e.g., $Vds\_t_{28}$) is smaller than the predetermined high voltage-drop threshold and larger than the predetermined low voltage-drop threshold, the increase signal 1011 (e.g., a comparison signal) is at the logic low level and the decrease signal 1013 (e.g., a comparison signal) is also at the logic low level.

According to certain embodiments, the control signal generator 1020 uses the signal 571 to determine the frequency of the control signal 577 and uses the increase signal 1011 and the decrease signal 1013 to determine the pulse width of the control signal 577. For example, the pulse width of the control signal 577 represents the time duration when the drive voltage 535 remains at the logic high level and the transistor 560 remains turned on. In certain examples, if the increase signal 1011 changes from the logic low level to the logic high level and the decrease signal 1013 is at the logic low level, the control signal generator 1020 increases the pulse width of the control signal 577. For example, the pulse width of the control signal 577 increases from the time duration $T_{onA}$ to the time duration $T_{onB}$, wherein the time duration $T_{onA}$ is smaller than the time duration $T_{onB}$. In some examples, if the increase signal 1011 is at the logic low level and the decrease signal 1013 changes from the logic low level to the logic high level, the control signal generator 1020 decreases the pulse width of the control signal 577. As an example, the pulse width of the control signal 577 decreases from the time duration $T_{onA}$ to the time duration $T_{onB}$, wherein the time duration $T_{onA}$ is smaller than the time duration $T_{onB}$. In certain examples, if the increase signal 1011 is at the logic low level and the decrease signal 1013 is also at the logic low level, the control signal generator 1020 does not change the pulse width of the control signal 577. For example, the pulse width of the control signal 577 remains constant, equal to the time duration $T_{onA}$ and equal to the time duration $T_{onB}$, wherein the time duration $T_{onA}$ and the time duration $T_{onB}$ are equal.

Figure 11A:
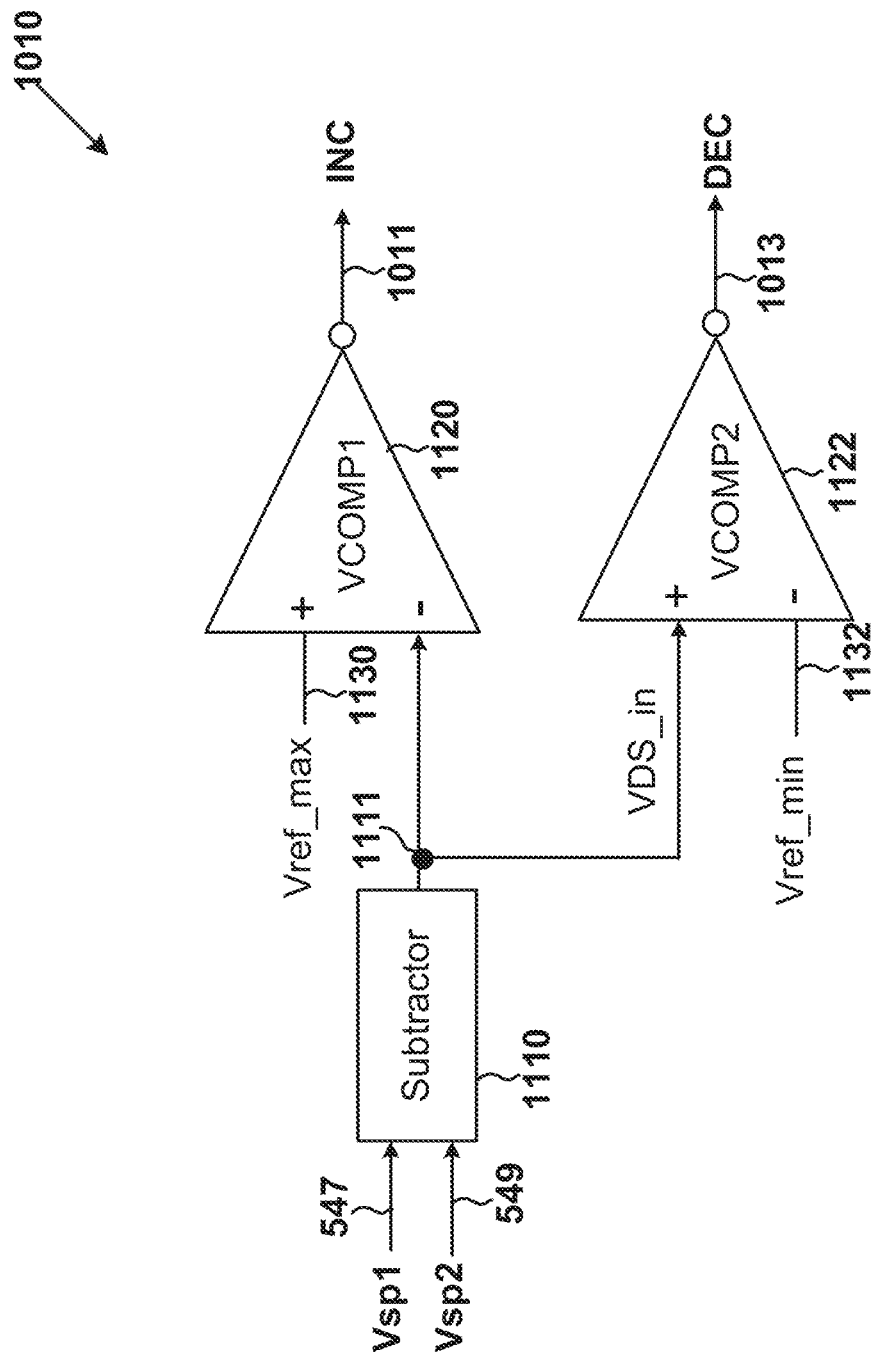
FIG. 11A is a simplified diagram showing the processing and comparison unit of the on-time controller as part of the quasi-resonant switch-mode power converter as shown in FIG. 5 and FIG. 10 according to certain embodiments of the present invention.

FIG. 11A is a simplified diagram showing the processing and comparison unit 1010 of the on-time controller 570 as part of the quasi-resonant switch-mode power converter 500 as shown in FIG. 5 and FIG. 10 according to certain embodiments of the present invention. This diagram is merely an example, which should not unduly limit the scope of the claims. One of ordinary skill in the art would recognize many variations, alternatives, and modifications. The processing and comparison unit 1010 includes a subtractor 1110, a combination 1120 including a comparator and a NOT gate, a combination 1122 including a comparator and a NOT gate. Although the above has been shown using a selected group of components for the processing and comparison unit 1010, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 11A, the subtractor 1110 receives the detection signals 547 and 549 and generates a difference signal 1111 based at least in part on the detection signals 547 and 549 according to some embodiments. For example, the detection signal 547 is a voltage (e.g., $V_{sp1}$), and the detection signal 549 is also a voltage (e.g., $V_{sp2}$). As an example, the difference signal 1111 is a voltage (e.g., $V_{DS\_in}$). In certain examples, the difference signal 1111 represents the determined difference between the detection signals 547 and 549. For example, the determined difference between the detection signals 547 and 549 indicates the voltage drop from the drain terminal 554 to the source terminal 558 of the transistor 550 (e.g., according to Equation 6).

In certain embodiments, the combination 1120 receives the difference signal 1111 (e.g., $V_{DS\_in}$) and a predetermined high reference 1130 (e.g., $V_{ref\_max}$) and generates the increase signal 1011. For example, if the difference signal 1111 (e.g., $V_{DS\_in}$) is larger than the predetermined high reference 1130 (e.g., $V_{ref\_max}$), the combination 1120 generates the increase signal 1011 at the logic high level. As an example, if the difference signal 1111 (e.g., $V_{DS\_in}$) is smaller than the predetermined high reference 1130 (e.g., $V_{ref\_max}$), the combination 1120 generates the increase signal 1011 at the logic low level.

In some embodiments, the combination 1122 receives the difference signal 1111 (e.g., $V_{DS\_in}$) and a predetermined low reference 1132 (e.g., $V_{ref\_min}$) and generates the decrease signal 1013. For example, if the difference signal 1111 (e.g., $V_{DS\_in}$) is smaller than the predetermined low reference 1132 (e.g., $V_{ref\_min}$), the combination 1122 generates the decrease signal 1013 at the logic high level. As an example, if the difference signal 1111 (e.g., $V_{DS\_in}$) is larger than the predetermined low reference 1132 (e.g., $V_{ref\_min}$), the combination 1122 generates the decrease signal 1013 at the logic low level.

Figure 11B:
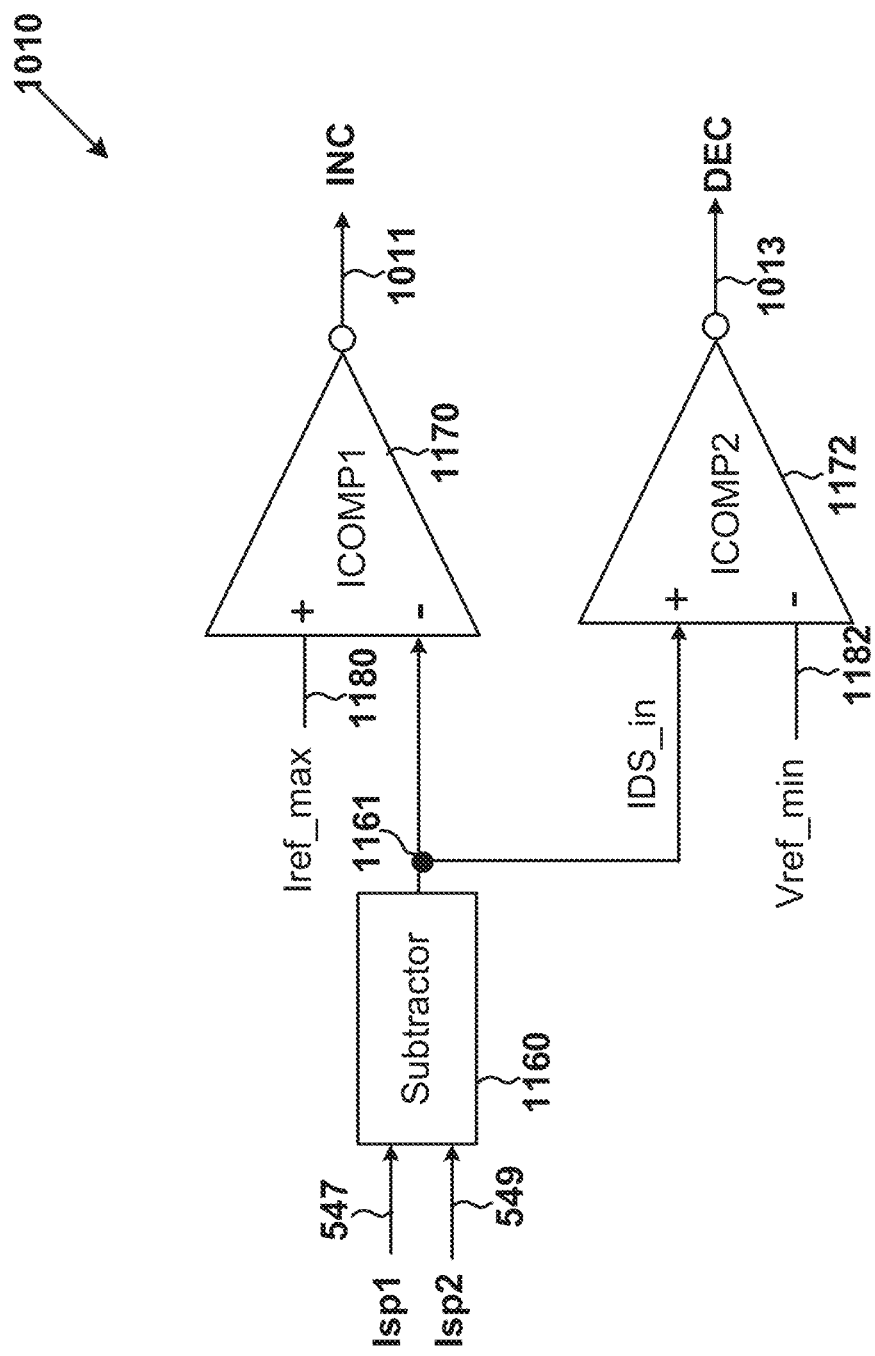
FIG. 11B is a simplified diagram showing the processing and comparison unit of the on-time controller as part of the quasi-resonant switch-mode power converter as shown in FIG. 5 and FIG. 10 according to certain embodiments of the present invention.

FIG. 11B is a simplified diagram showing the processing and comparison unit 1010 of the on-time controller 570 as part of the quasi-resonant switch-mode power converter 500 as shown in FIG. 5 and FIG. 10 according to certain embodiments of the present invention. This diagram is merely an example, which should not unduly limit the scope of the claims. One of ordinary skill in the art would recognize many variations, alternatives, and modifications. The processing and comparison unit 1010 includes a subtractor 1160, a combination 1170 including a comparator and a NOT gate, a combination 1172 including a comparator and a NOT gate. Although the above has been shown using a selected group of components for the processing and comparison unit 1010, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 11B, the subtractor 1160 receives the detection signals 547 and 549 and generates a difference signal 1161 based at least in part on the detection signals 547 and 549 according to some embodiments. For example, the detection signal 547 is a current (e.g., $I_{sp1}$), and the detection signal 549 is also a current (e.g., $I_{sp2}$). As an example, the difference signal 1161 is a current (e.g., $I_{DS\_in}$). In certain examples, the difference signal 1161 represents the determined difference between the detection signals 547 and 549. For example, the determined difference between the detection signals 547 and 549 indicates the voltage drop from the drain terminal 554 to the source terminal 558 of the transistor 550 (e.g., according to Equation 6).

In certain embodiments, the combination 1170 receives the difference signal 1161 (e.g., $I_{DS\_in}$) and a predetermined high reference 1180 (e.g., $I_{ref\_max}$) and generates the increase signal 1011. For example, if the difference signal 1161 (e.g., $I_{DS\_in}$) is larger than the predetermined high reference 1180 (e.g., $I_{ref\_max}$), the combination 1170 generates the increase signal 1061 at the logic high level. As an example, if the difference signal 1161 (e.g., $I_{DS\_in}$) is smaller than the predetermined high reference 1180 (e.g., $I_{ref\_max}$), the combination 1170 generates the increase signal 1011 at the logic low level.

In some embodiments, the combination 1127 receives the difference signal 1161 (e.g., $I_{DS\_in}$) and a predetermined low reference 1182 (e.g., $I_{ref\_min}$) and generates the decrease signal 1013. For example, if the difference signal 1161 (e.g., $V_{DS\_in}$) is smaller than the predetermined low reference 1182 (e.g., $I_{ref\_min}$), the combination 1172 generates the decrease signal 1013 at the logic high level. As an example, if the difference signal 1161 (e.g., $I_{DS\_in}$) is larger than the predetermined low reference 1182 (e.g., $I_{ref\_min}$), the combination 1172 generates the decrease signal 1013 at the logic low level.

Figure 12:
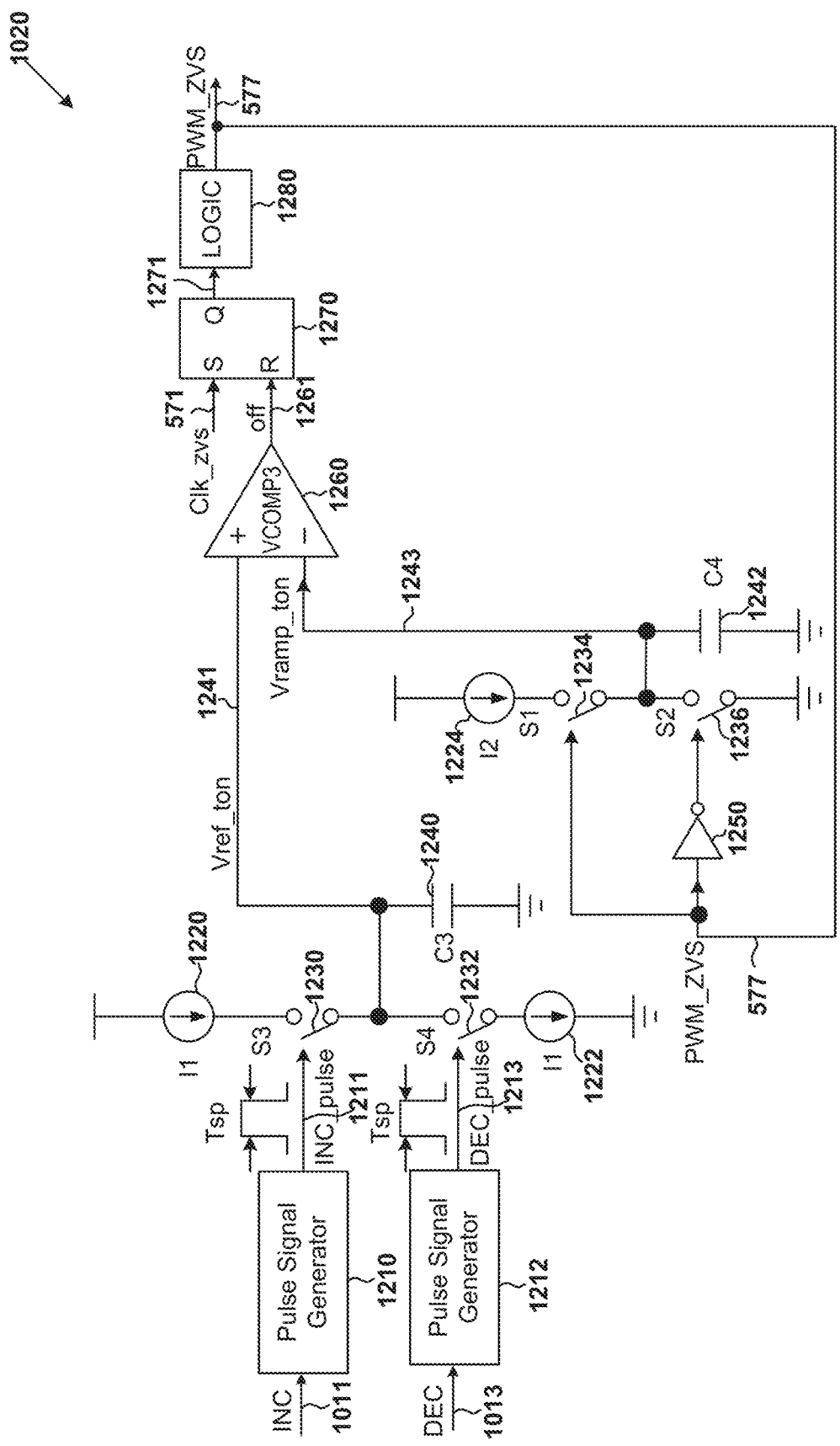
FIG. 12 is a simplified diagram showing the control signal generator of the on-time controller as part of the quasi-resonant switch-mode power converter as shown in FIG. 5 and FIG. 10 according to certain embodiments of the present invention.

FIG. 12 is a simplified diagram showing the control signal generator 1020 of the on-time controller 570 as part of the quasi-resonant switch-mode power converter 500 as shown in FIG. 5 and FIG. 10 according to certain embodiments of the present invention. This diagram is merely an example, which should not unduly limit the scope of the claims. One of ordinary skill in the art would recognize many variations, alternatives, and modifications. The control signal generator 1020 includes pulse signal generators 1210 and 1212, current sources 1220 and 1224, a current sink 1222, switches 1230, 1232, 1234 and 1236, capacitors 1240 and 1242, a NOT gate 1250, a comparator 1260, a flip flop 1270, and a logic component 1280. Although the above has been shown using a selected group of components for the control signal generator 1020, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 12, the pulse signal generator 1210 receives the increase signal 1011 and generates the pulse signal 1211 based at least in part on the increase signal 1011, and the pulse signal generator 1212 receives the decrease signal 1013 and generates the pulse signal 1213 based at least in part on the decrease signal 1013 according to some embodiments. For example, the pulse signals 1211 and 1213 are used to control charging and/or discharging of the capacitor 1240. As an example, the capacitor 1240 generates a control signal 1241 (e.g., $V_{ref\_ton}$). As an example, the capacitor 1240 changes the control signal 1241 (e.g., $V_{ref\_ton}$) in response to charging and/or discharging of the capacitor 1240.

In certain embodiments, the control signal 577 is used to control charging and/discharging of the capacitor 1242. For example, the capacitor 1242 generates a ramp signal 1243 (e.g., $V_{ramp\_ton}$). As an example, the capacitor 1242 changes the ramp signal 1243 (e.g., $V_{ramp\_ton}$) in response to charging and/or discharging of the capacitor 1242. In some embodiments, the control signal 1241 (e.g., $V_{ref\_ton}$) and the ramp signal 1243 (e.g., $V_{ramp\_ton}$) are received by the comparator 1260, which in response generates a control signal 1261. For example, the flip flop 1270 receives the control signal 1261 and the signal 571 and generates a signal 1271. As an example, the signal 1271 is received by the logic component 1280, which in response generates the control signal 577.

In some embodiments, the pulse signal generator 1210 generates a pulse in the pulse signal 1211 in response to the increase signal 1011 changing from the logic low level to the logic high level. For example, each pulse in the pulse signal 1211 has a pulse width of $T_{sp}$. As an example, during each pulse of the pulse signal 1211, the switch 1230 is closed. In certain embodiments, the pulse signal generator 1212 generates a pulse in the pulse signal 1213 in response to the decrease signal 1013 changing from the logic low level to the logic high level. For example, each pulse in the pulse signal 1213 has a pulse width of $T_{sp}$. As an example, during each pulse of the pulse signal 1213, the switch 1232 is closed. In certain examples, if the switch 1230 is closed and the switch 1232 is open, the capacitor 1240 is charged to increase the control signal 1241 (e.g., $V_{ref\_ton}$). In some examples, if the switch 1230 is open and the switch 1232 is closed, the capacitor 1240 is discharged to decrease the control signal 1241 (e.g., $V_{ref\_ton}$).

In certain embodiments, if the control signal 577 is at the logic high level, the switch 1234 is closed and the switch 1236 is open, charging the capacitor 1242 and causing the ramp signal 1243 (e.g., $V_{ramp\_ton}$) to increase. In some embodiments, if the control signal 577 is at the logic low level, the switch 1234 is open and the switch 1236 is closed, discharging the capacitor 1242 and causing the ramp signal 1243 (e.g., $V_{ramp\_ton}$) to decrease.

As shown in FIG. 12, the comparator 1260 compares the control signal 1241 (e.g., $V_{ref\_ton}$) and the ramp signal 1243 (e.g., $V_{ramp\_ton}$) and generates the control signal 1261 based at least in part on the control signal 1241 (e.g., $V_{ref\_ton}$) and the ramp signal 1243 (e.g., $V_{ramp\_ton}$) according to some embodiments. For example, the flip flop 1270 receives the control signal 1261 and the signal 571 and generates the signal 1271. As an example, the signal 1271 is received by the logic component, which in response generates the control signal 577.

Figure 13:
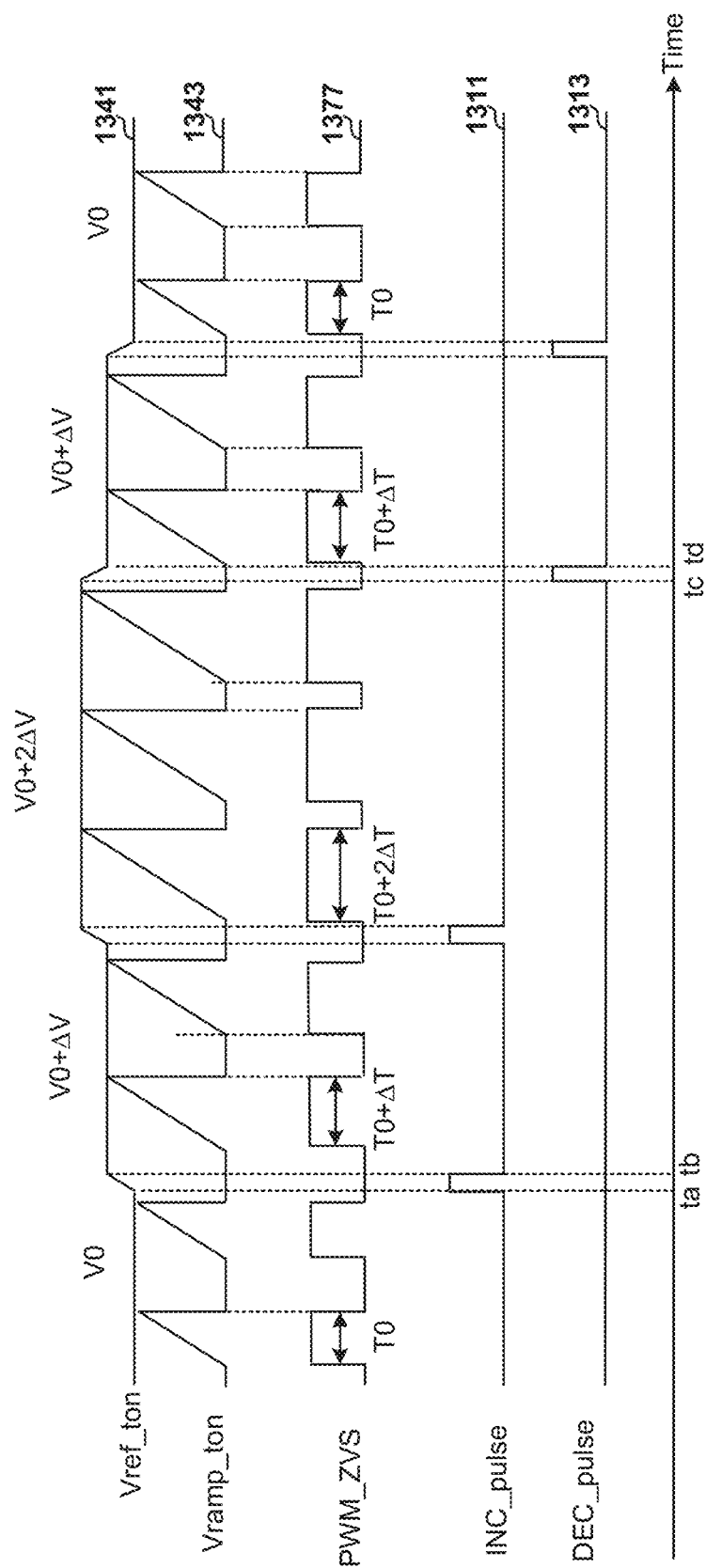
FIG. 13 shows simplified timing diagrams for the control signal generator of the on-time controller as part of the quasi-resonant switch-mode power converter as shown in FIG. 5, FIG. 10 and FIG. 12 according to certain embodiments of the present invention.

FIG. 13 shows simplified timing diagrams for the control signal generator 1020 of the on-time controller 570 as part of the quasi-resonant switch-mode power converter 500 as shown in FIG. 5, FIG. 10 and FIG. 12 according to certain embodiments of the present invention. These diagrams are merely examples, which should not unduly limit the scope of the claims. One of ordinary skill in the art would recognize many variations, alternatives, and modifications. The waveform 1341 represents the control signal 1241 (e.g., $V_{ref\_ton}$) as a function of time, the waveform 1343 represents the ramp signal 1243 (e.g., $V_{ramp\_ton}$) as a function of time, the waveform 1377 represents the control signal 577 as a function of time, the waveform 1311 represents the pulse signal 1211 as a function of time, and the waveform 1313 represents the pulse signal 1213 as a function of time. For example, a pulse width of the control signal 577 represents the length of the time duration when the transistor 560 remains turned on.

At time ta, the pulse signal 1211 changes from a logic low level to a logic high level (e.g., in response to the increase signal 1011 changing from the logic low level to the logic high level) as shown by the waveform 1311, and the pulse signal 1213 remains at the logic low level (e.g., when the decrease signal 1013 remains at the logic low level) as shown by the waveform 1313 according to some embodiments. For example, at time ta, the switch 1230 becomes closed by the pulse signal 1211, and the switch 1232 remains open by the pulse signal 1213. As an example, at time ta, the capacitor 1240 starts being charged by the current source 1220, so that the control signal 1241 generated by the capacitor 1240 starts increasing from $V_0$ as shown by the waveform 1341.

From time $t_a$ to time $t_b$, the pulse signal 1211 remains at the logic high level as shown by the waveform 1311, and the pulse signal 1213 remains at the logic low level as shown by the waveform 1313 according to certain embodiments. For example, the time duration from time $t_a$ to time $t_b$ is equal to the pulse width $T_{sp}$ for the pulse signal 1211. In some examples, from time $t_a$ to time $t_b$, the switch 1230 remains closed, and the switch 1232 remains open. In certain examples, from time $t_a$ to time $t_b$, the capacitor 1240 is being charged by the current source 1220. For example, from time $t_a$ to time $t_b$, the control signal 1241 generated by the capacitor 1240 changes as follows:

$$\Delta V = \frac{I_1 \times T_{sp}}{C_3} \qquad \text{(Equation 11)}$$

where $\Delta V$ represents the change of the control signal 1241 from time $t_a$ to time $t_b$. Additionally, $I_1$ represents a current provided by the current source 1220, and $T_{sp}$ represents the time duration from time $t_a$ to time $t_b$. Also, $C_3$ represents the capacitance of the capacitor 1240.

At time $t_b$, the pulse signal 1211 changes from the logic high level to the logic low level as shown by the waveform 1311, and the pulse signal 1213 remains at the logic low level as shown by the waveform 1313 according to some embodiments. In certain examples, at time $t_b$, the switch 1230 becomes open, and the switch 1232 remains open. In certain examples, as shown by the waveform 1341, at time $t_b$, the control signal 1241 generated by the capacitor 1240 is determined as follows:

$$V_b = V_0 + \frac{I_1 \times T_{sp}}{C_3} \qquad \text{(Equation 12)}$$

where $V_b$ represents the control signal 1241 at time $t_b$, and $V_0$ represents the control signal 1241 at time $t_a$. Additionally, $I_1$ represents a current provided by the current source 1220, and $T_{sp}$ represents the time duration from time $t_a$ to time $t_b$. Also, $C_3$ represents the capacitance of the capacitor 1240.

According to certain embodiments, the control signal 577 has a pulse immediately before time $t_a$ and a pulse immediately after time $t_b$ as shown by the waveform 1377. For example, the pulse width for the pulse immediately before time $t_a$ is equal to $T_0$, and the pulse width for the pulse immediately after time $t_b$ is equal to $T_0+\Delta T$. As an example, $\Delta T$ is determined as follows:

$$\Delta T = \frac{C_4 \times \Delta V}{I_2} = \frac{C_4 \times I_1 \times T_{sp}}{C_3 \times I_2} \qquad \text{(Equation 13)}$$

where $C_4$ represents the capacitance of the capacitor 1242, and $I_2$ represents a current provided by the current source 1224. Additionally, $\Delta V$ represents the change of the control signal 1241 from time $t_a$ to time $t_b$. Moreover, $I_1$ represents a current provided by the current source 1220, and $T_{sp}$ represents the time duration from time $t_a$ to time $t_b$. Also, $C_3$ represents the capacitance of the capacitor 1240. For example, $\Delta T$ is changed by adjusting $C_3$, $I_1$, $C_4$, $I_2$ and/or $T_{sp}$. As an example, $\Delta T$ is used to adjust the magnitude of the voltage drop from the drain terminal 554 to the source terminal 558 of the transistor 550.

At time $t_c$, the pulse signal 1213 changes from the logic low level to the logic high level (e.g., in response to the decrease signal 1013 changing from the logic low level to the logic high level) as shown by the waveform 1313, and the pulse signal 1211 remains at the logic low level (e.g., when the increase signal 1011 remains at the logic low level) as shown by the waveform 1311 according to some embodiments. For example, at time to, the switch 1232 becomes closed by the pulse signal 1213 and the switch 1230 remains open by the pulse signal 1211. As an example, at time $t_c$, the capacitor 1240 starts being discharged by the current sink 1222, so that the control signal 1241 generated by the capacitor 1240 starts decreasing from $V_0+2\times\Delta V$ as shown by the waveform 1341, wherein $V_0$ represents the control signal 1241 at time $t_a$, and $\Delta V$ is determined according to Equation 11. In certain examples, the current received by the current sink 1222 and the current provided by the current source 1220 have the same magnitude.

From time $t_c$ to time $t_d$, the pulse signal 1213 remains at the logic high level as shown by the waveform 1313, and the pulse signal 1211 remains at the logic low level as shown by the waveform 1311 according to certain embodiments. For example, the time duration from time $t_c$ to time $t_d$ is equal to the pulse width $T_{sp}$ for the pulse signal 1213. As an example, the time duration from time $t_c$ to time $t_d$ and the time duration from time $t_a$ to time $t_b$ have the same magnitude. In some examples, from time $t_c$ to time $t_d$, the switch 1232 remains closed, and the switch 1230 remains open. In certain examples, from time $t_0$ to time $t_d$, the capacitor 1240 is being discharged by the current sink 1222. For example, from time $t_c$ to time $t_d$, the control signal 1241 generated by the capacitor 1240 decreases by $\Delta V$ according to Equation 11.

At time $t_d$, the pulse signal 1213 changes from the logic high level to the logic low level as shown by the waveform 1313, and the pulse signal 1211 remains at the logic low level as shown by the waveform 1311 according to some embodiments. In certain examples, at time $t_d$, the switch 1232 becomes open, and the switch 1230 remains open. In certain examples, as shown by the waveform 1341, at time $t_d$, the control signal 1241 is equal to $V_0+\Delta V$, wherein $V_0$ represents the control signal 1241 at time $t_a$, and $\Delta V$ is determined according to Equation 11.

According to certain embodiments, the control signal 577 has a pulse immediately before time $t_c$ and a pulse immediately after time $t_d$ as shown by the waveform 1377. For example, the pulse width for the pulse immediately before time $t_a$ is equal to $T_0+2\times\Delta T$, and the pulse width for the pulse immediately after time $t_b$ is equal to $T_0+\Delta T$, where $T_0$ represents the pulse width for the pulse immediately before time $t_a$, and DT is determined according to Equation 13.

According to some embodiments, if the increase signal 1011 and the decrease signal 1013 both remain at the logic low level, the pulse signals 1211 and 1213 both remain at the logic low level as shown by the waveforms 1311 and 1313. For example, if the pulse signals 1211 and 1213 both remain at the logic low level, the control signal 1241 remains unchanged as shown by the waveform 1341. As an example, if the control signal 1241 remains unchanged, the pulse width of the control signal 577 remains unchanged as shown by the waveform 1377.

Figure 14:
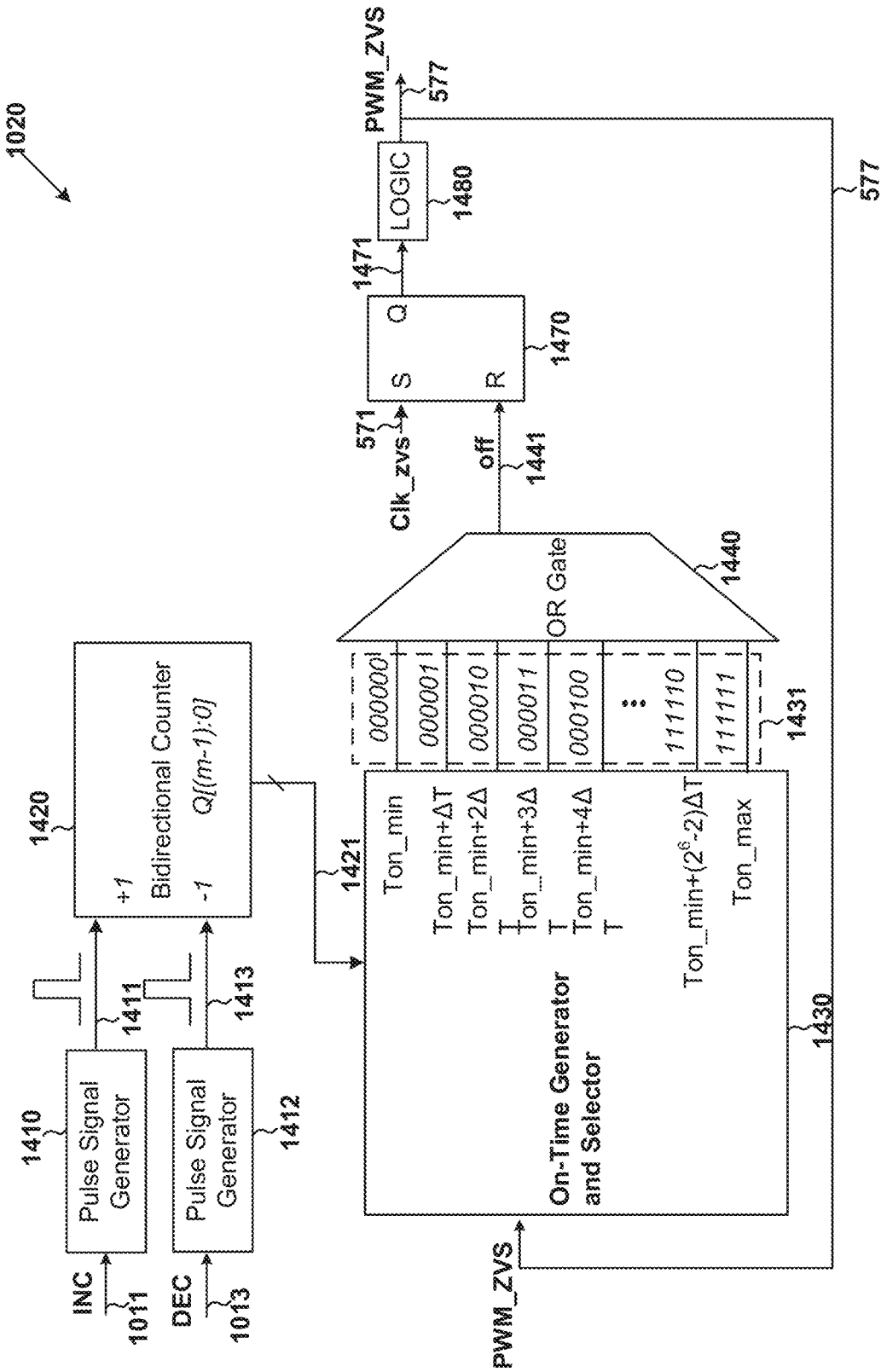
FIG. 14 is a simplified diagram showing the control signal generator of the on-time controller as part of the quasi-resonant switch-mode power converter as shown in FIG. 5 and FIG. 10 according to certain embodiments of the present invention.

FIG. 14 is a simplified diagram showing the control signal generator 1020 of the on-time controller 570 as part of the quasi-resonant switch-mode power converter 500 as shown in FIG. 5 and FIG. 10 according to certain embodiments of the present invention. This diagram is merely an example, which should not unduly limit the scope of the claims. One of ordinary skill in the art would recognize many variations, alternatives, and modifications. The control signal generator 1020 includes pulse signal generators 1410 and 1412, a bidirectional counter 1420, an on-time generator and selector 1430, an OR gate 1440, a flip flop 1470, and a logic component 1480. Although the above has been shown using a selected group of components for the control signal generator 1020, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 14, the pulse signal generator 1410 receives the increase signal 1011 and generates the pulse signal 1411 based at least in part on the increase signal 1011, and the pulse signal generator 1412 receives the decrease signal 1013 and generates the pulse signal 1413 based at least in part on the decrease signal 1013 according to some embodiments. In certain examples, the bidirectional counter 1420 receives the pulse signals 1411 and 1413 and generates a count signal 1421 based at least in part on the pulse signals 1411 and 1413. For example, the count signal 1421 is a binary code signal with m bits (e.g., Q[(m−1):0]), where m is a positive integer (e.g., 1), so that the count signal 1421 represents an integer that is larger than or equal to zero and is also smaller than or equal to $2^m-1$. As an example, m is equal to 6. In some examples, the on-time generator and selector 1430 receives the count signal 1421 (e.g., a binary code signal with m bits Q[(m−1):0]) and the control signal 577, selects an on time that corresponds to the count signal 1421, and generates an on-time signal 1431 that represents the selected on time. For example, the on-time signal 1431 includes $2^m$ signals (e.g., signals 1430₀, 1430₁, 1430₂, ..., and 1430$_{2^m-1}$, where m is a positive integer). As an example, among the $2^m$ signals of the on-time signal 1431, one signal that corresponds to the selected on time includes a pulse with a pulse width that is equal to the selected on time, and all other signals remain at a logic low level without any pulses.

According to certain embodiments, the on-time signal 1431 that includes the $2^m$ signals (e.g., signals 1430₀, 1430₁, 1430₂, ..., and 1430$_{2^m-1}$, where m is a positive integer) is received by the OR gate 1440, which in response generates a control signal 1441. For example, the control signal 1441 is used to turn off the transistor 560. In some examples, the control signal 1441 is received by the flip flop 1270. For example, the flip flop 1270 also receives the signal 571 and generates a signal 1471. As an example, the signal 1471 is received by the logic component 1480, which in response generates the control signal 577.

According to some embodiments, each pulse in the pulse signal 1411 has a pulse width of $T_{sp}$, and each pulse in the pulse signal 1413 also has the pulse width of $T_{sp}$. In some examples, the pulse signals 1411 and 1413 are received by the bidirectional counter 1420, which in response changes the count signal 1421. For example, in response to a pulse of the pulse signal 1411, the bidirectional counter 1420 changes the count signal 1421 so that the integer represented by the count signal 1421 increases by 1. As an example, in response to a pulse of the pulse signal 1413, the bidirectional counter 1420 changes the count signal 1421 so that the integer represented by the count signal 1421 decreases by 1. In certain examples, a larger integer represented by the count signal 1421 corresponds to a longer on time, and a smaller integer represented by the count signal 1421 corresponds to a shorter on time.

In certain embodiments, the on-time signal 1431 includes the $2^m$ signals (e.g., signals 1430₀, 1430₁, 1430₂, ..., and 1430$_{2^m-1}$, where m is a positive integer). For example, m is equal to 6. As an example, if m is equal to 6, the integer represented by the count signal 1421 is one of sixty-four integers that are larger than or equal to zero (e.g., 000000 in binary) and is also smaller than or equal to 63 (e.g., 111111 in binary).

In some examples, the on-time generator and selector 1430 divides the difference between the maximum time duration when the drive voltage 535 remains at the logic high level (e.g., the maximum time duration when the transistor 560 remains turned on) and the minimum time duration when the drive voltage 535 remains at the logic high level (e.g., the minimum time duration when the transistor 560 remains turned on) into $2^m-1$ equal time segments, each time segment being represented by $\Delta T$. For example, each time segment is determined as follows:

$$\Delta T = \frac{T_{on\_max} - T_{on\_min}}{2^m - 1} \quad \text{(Equation 14)}$$

where $\Delta T$ represents a time segment of the $2^m-1$ equal time segments. Additionally, $T_{on\_max}$ represents the maximum time duration when the drive voltage 535 remains at the logic high level (e.g., the maximum time duration when the transistor 560 remains turned on), and $T_{on\_min}$ represents the minimum time duration when the drive voltage 535 remains at the logic high level (e.g., the minimum time duration when the transistor 560 remains turned on). For example, m is equal to 6.

In certain examples, an integer represented by the count signal 1421 that is larger than or equal to zero and is also smaller than or equal to $2^m-1$ corresponds to a time duration when the drive voltage 535 remains at the logic high level (e.g., a time duration when the transistor 560 remains turned on) that is longer than or equal to the minimum time duration and is shorter than or equal to the maximum time duration. For example, the time duration when the drive voltage 535 remains at the logic high level (e.g., the time duration when the transistor 560 remains turned on) and the integer represented by the count signal 1421 has the following relationship:

$$T_D = T_{on\_min} + \Delta T \times i \qquad \text{(Equation 15)}$$

where $T_D$ represents the time duration when the drive voltage 535 remains at the logic high level (e.g., the time duration when the transistor 560 remains turned on), and i represents the integer represented by the count signal 1421. Additionally, $T_{on\_min}$ represents the minimum time duration when the drive voltage 535 remains at the logic high level (e.g., the minimum time duration when the transistor 560 remains turned on), and $\Delta T$ represents a time segment of the $2^m-1$ equal time segments. For example, $0 \le i \le 2^m-1$, and $T_{on\_min} \le T_D \le T_{on\_max}$. As an example, if i equals 0 (e.g., 000000 in binary), $T_d$ equals $T_{on\_min}$, and if i equals $2^m-1$ (e.g., 111111 in binary), $T_d$ equals $T_{on\_max}$.

As discussed above and further emphasized here, FIG. 14 is merely an example, which should not unduly limit the scope of the claims. One of ordinary skill in the art would recognize many variations, alternatives, and modifications. For example, m is a positive integer that is not equal to 6.

Figure 15:
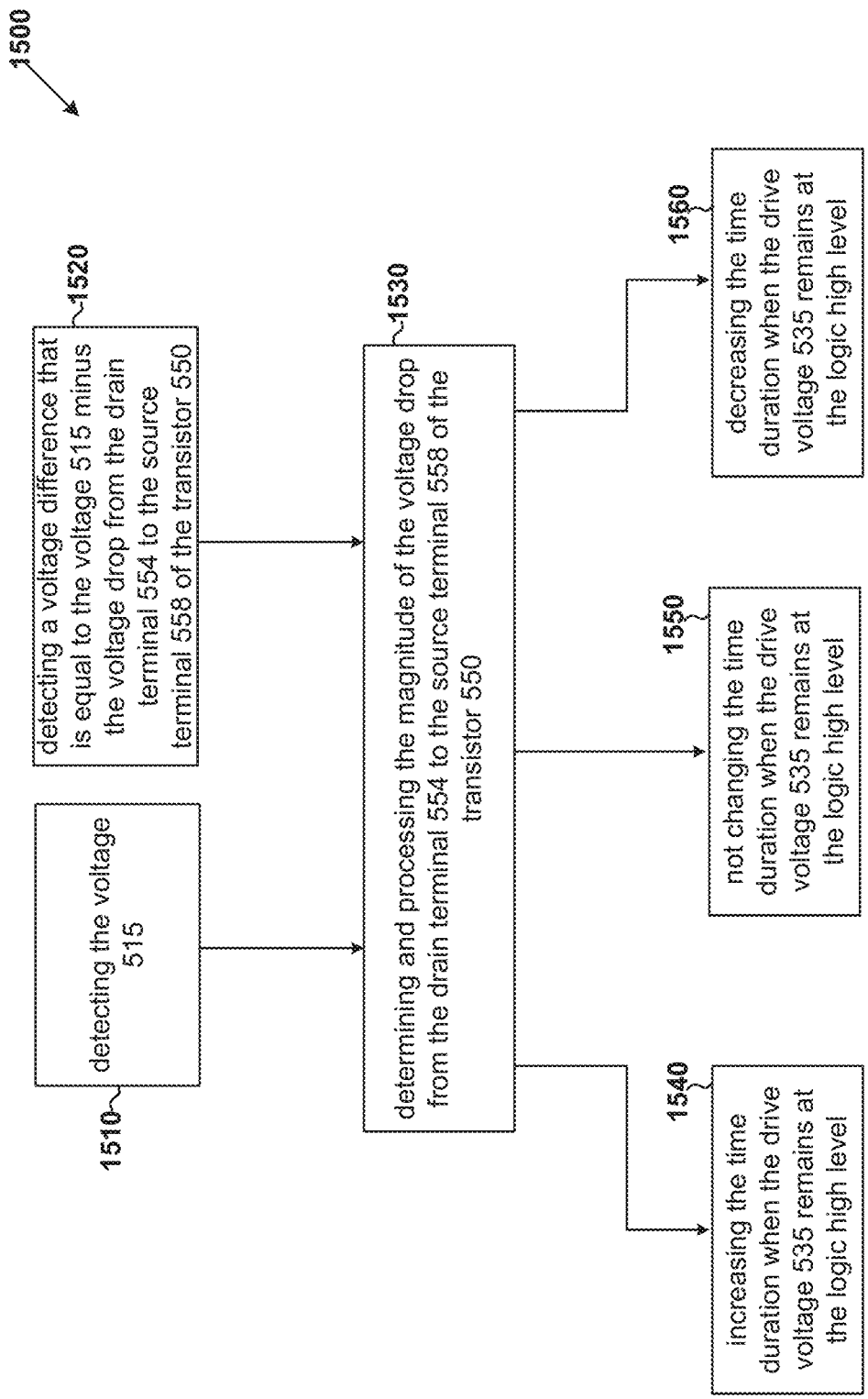
FIG. 15 is a simplified diagram showing a method for the quasi-resonant switch-mode power converter as shown in FIG. 5 according to certain embodiments of the present invention.

FIG. 15 is a simplified diagram showing a method for the quasi-resonant switch-mode power converter 500 as shown in FIG. 5 according to certain embodiments of the present invention. This diagram is merely an example, which should not unduly limit the scope of the claims. One of ordinary skill in the art would recognize many variations, alternatives, and modifications. The method 1500 includes a process 1510 for detecting the voltage 515, a process 1520 for detecting a voltage difference that is equal to the voltage 515 minus the voltage drop from the drain terminal 554 to the source terminal 558 of the transistor 550, a process 1530 for determining and processing the magnitude of the voltage drop from the drain terminal 554 to the source terminal 558 of the transistor 550, a process 1540 for increasing the time duration when the drive voltage 535 remains at the logic high level, a process 1550 for not changing the time duration when the drive voltage 535 remains at the logic high level, and a process for decreasing the time duration when the drive voltage 535 remains at the logic high level. Although the above has been shown using a selected group of processes for the method 1500, there can be many alternatives, modifications, and variations. For example, some of the processes may be expanded and/or combined. Other processes may be inserted to those noted above. Depending upon the embodiment, the sequence of processes may be interchanged with others replaced. Further details of these processes are found throughout the present specification.

At the process 1510, the voltage 515 is detected when the transistor 550 is turned on and the transistor 560 is turned off based at least in part on the current 541 according to some embodiments.

At the process 1520, a voltage difference that is equal to the voltage 515 minus the voltage drop from the drain terminal 554 to the source terminal 558 of the transistor 550 is detected when the transistor 550 is turned off and the transistor 560 is also turned off based at least in part on the current 541 according to certain embodiments. For example, the voltage drop from the drain terminal 554 to the source terminal 558 of the transistor 550 is equal to the voltage at the drain terminal 554 minus the voltage at the source terminal 558.

At the process 1530, the magnitude of the voltage drop from the drain terminal 554 to the source terminal 558 of the transistor 550 is determined and processed according to some embodiments. For example, the on-time controller 570 uses the detection signals 547 and 549 to determine the magnitude of the voltage drop from the drain terminal 554 to the source terminal 558 of the transistor 550. As an example, the on-time controller 570 compares the determined magnitude of the voltage drop from the drain terminal 554 to the source terminal 558 of the transistor 550 with the predetermined high voltage-drop threshold, and/or compares the determined magnitude of the voltage drop from the drain terminal 554 to the source terminal 558 of the transistor 550 with the predetermined low voltage-drop threshold.

At the process 1540, the time duration when the drive voltage 535 remains at the logic high level is increased if the determined magnitude of the voltage drop from the drain terminal 554 to the source terminal 558 of the transistor 550 is larger than the predetermined high voltage-drop threshold according to certain embodiments. For example, as shown in FIG. 6, if the voltage drop from the drain terminal 554 to the source terminal 558 of the transistor 550 at time $t_{28}$ (e.g., $Vds\_t_{28}$) is larger than the predetermined high voltage-drop threshold, the on-time controller 570 increases the time duration when the drive voltage 535 remains at the logic high level in order to reduce the voltage drop from the drain terminal 554 to the source terminal 558 of the transistor 550 immediately before the drive voltage 551 changes from the logic low level to the logic high level and the transistor 550 becomes turned on.

At the process 1550, the time duration when the drive voltage 535 remains at the logic high level is not changed, if the determined magnitude of the voltage drop from the drain terminal 554 to the source terminal 558 of the transistor 550 is smaller than the predetermined high voltage-drop threshold and larger than the predetermined low voltage-drop threshold according to some embodiments. For example, as shown in FIG. 6, if the voltage drop from the drain terminal 554 to the source terminal 558 of the transistor 550 at time $t_{28}$ (e.g., $Vds\_t_{28}$) is smaller than the predetermined high voltage-drop threshold and larger than the predetermined low voltage-drop threshold, the on-time controller 570 does not change the time duration when the drive voltage 535 remains at the logic high level in order not to change the voltage drop from the drain terminal 554 to the source terminal 558 of the transistor 550 immediately before the drive voltage 551 changes from the logic low level to the logic high level and the transistor 550 becomes turned on.

At the process 1540, the time duration when the drive voltage 535 remains at the logic high level is decreased if the determined magnitude of the voltage drop from the drain terminal 554 to the source terminal 558 of the transistor 550 is smaller than the predetermined low voltage-drop threshold according to certain embodiments. For example, as shown in FIG. 6, if the voltage drop from the drain terminal 554 to the source terminal 558 of the transistor 550 at time $t_{28}$ (e.g., $Vds\_t_{28}$) is smaller than the predetermined low voltage-drop threshold, the on-time controller 570 decreases the time duration when the drive voltage 535 remains at the logic high level in order to increase the voltage drop from the drain terminal 554 to the source terminal 558 of the transistor 550 immediately before the drive voltage 551 changes from the logic low level to the logic high level and the transistor 550 becomes turned on.

Some embodiments of the present invention provide the controller chip 520 of the quasi-resonant switch-mode power converter 500 that detects the magnitude of the voltage drop from the drain terminal 554 to the source terminal 558 of the transistor 550 and in response, adaptively adjusts the time duration when the drive voltage 535 remains at the logic high level (e.g., the time duration when the transistor 560 remains turned on). For example, the controller chip 520 of the quasi-resonant switch-mode power converter 500 can control the magnitude of the voltage drop from the drain terminal 554 to the source terminal 558 of the transistor 550 so that the magnitude of the voltage drop from the drain terminal 554 to the source terminal 558 of the transistor 550 falls between the predetermined low voltage-drop threshold and the predetermined high voltage-drop threshold. In certain examples, the controller for the flyback switch-mode power converter (e.g., the controller chip 520 of the quasi-resonant switch-mode power converter 500) can reduce (e.g., minimize) the switching loss of a transistor on the primary side of the flyback switch-mode power converter (e.g., the transistor 550 on the primary side of the quasi-resonant switch-mode power converter 500). In some examples, the controller for the flyback switch-mode power converter (e.g., the controller chip 520 of the quasi-resonant switch-mode power converter 500) can reduce power consumption and improve electromagnetic interference (EMI) performance of the flyback switch-mode power converter.

According to certain embodiments, a controller for a power converter includes: a first gate driver configured to output a first drive signal to a first transistor related to a primary winding, the first transistor including a drain terminal and a source terminal, the primary winding being configured to receive an input voltage, the primary being coupled to a first auxiliary winding and a second auxiliary winding; one or more voltage detectors configured to generate a first detection signal and a second detection signal based at least in part on a current signal related to the first auxiliary winding; a time controller configured to receive the first detection signal and the second detection signal and generate a control signal based at least in part on the first detection signal and the second detection signal; and a second gate driver configured to receive the control signal, generate a second drive signal based at least in part on the control signal, and output the second drive signal to a second transistor related to the second auxiliary winding; wherein the one or more voltage detectors are further configured to: at a first time when the first drive signal is at a first logic level and the second drive signal is at a second logic level, detect the input voltage based at least in part on the current signal; and at a second time when the first drive signal is at the second logic level and the second drive signal is also at the second logic level, detect the input voltage minus a voltage drop from the drain terminal to the source terminal of the first transistor based at least in part on the current signal; wherein the one or more voltage detectors are further configured to: generate the first detection signal representing the input voltage at the first time; and generate the second detection signal representing the input voltage minus the voltage drop from the drain terminal to the source terminal of the first transistor at the second time; wherein the time controller is further configured to: determine the voltage drop from the drain terminal to the source terminal of the first transistor based at least in part on the first detection signal and the second detection; and determine a time duration when the second drive signal remains at the first logic level based at least in part on the determined voltage drop from the drain terminal to the source terminal of the first transistor. For example, the controller for the power converter is implemented according to at least FIG. 5.

As an example, the time controller is further configured to: if the determined voltage drop from the drain terminal to the source terminal of the first transistor is larger than a first threshold, increase the time duration when the second drive signal remains at the first logic level; and if the determined voltage drop from the drain terminal to the source terminal of the first transistor is smaller than a second threshold, decrease the time duration when the second drive signal remains at the first logic level; wherein the first threshold is larger than the second threshold. For example, the time controller is further configured to, if the determined voltage drop from the drain terminal to the source terminal of the first transistor is smaller than the first threshold but larger than the second threshold, not change the time duration when the second drive signal remains at the first logic level.

As an example, the time controller includes a processing and comparison unit and a control signal generator. For example, the processing and comparison unit is configured to: receive the first detection signal and the second detection signal; and determine the voltage drop from the drain terminal to the source terminal of the first transistor based at least in part on the first detection signal and the second detection. As an example, the processing and comparison unit is further configured to: compare the determined voltage drop from the drain terminal to the source terminal of the first transistor with the first threshold; and compare the determined voltage drop from the drain terminal to the source terminal of the first transistor with the second threshold. For example, the processing and comparison unit is further configured to: generate a first comparison signal indicating whether the determined voltage drop from the drain terminal to the source terminal of the first transistor becomes larger than the first threshold; and generate a second comparison signal indicating whether the determined voltage drop from the drain terminal to the source terminal of the first transistor becomes smaller than the second threshold. As an example, the control signal generator is configured to receive the first comparison signal and the second comparison signal. For example, the control signal generator is further configured to, if the first comparison signal indicates that the determined voltage drop from the drain terminal to the source terminal of the first transistor becomes larger than the first threshold: generate a first pulse in a first pulse signal; and use the first pulse in the first pulse signal to increase the time duration when the second drive signal remains at the first logic level. As an example, the control signal generator is further configured to, if the second comparison signal indicates that the determined voltage drop from the drain terminal to the source terminal of the first transistor becomes smaller than the second threshold: generate a second pulse in a second pulse signal; and use the second pulse in the second pulse signal to decrease the time duration when the second drive signal remains at the first logic level.

For example, the first gate driver is further configured to: generate the first drive signal at the first logic level to turn on the first transistor; and generate the first drive signal at the second logic level to turn off the first transistor. As an example, the second gate driver is further configured to: generate the second drive signal at the first logic level to turn on the second transistor; and generate the second drive signal at the second logic level to turn off the second transistor.

For example, the first logic level is a logic high level; and the second logic level is a logic low level. As an example, the one or more voltage detectors include one voltage detector configured to generate the first detection signal and the second detection signal based at least in part on the current signal. For example, the one or more voltage detectors include a first voltage detector and a second voltage detector; wherein: the first voltage detector is configured to generate the first detection signal based at least in part on the current signal; and the second voltage detector is configured to generate the second detection signal based at least in part on the current signal. As an example, the first detection signal is a first voltage; and the second detection signal is a second voltage. For example, the first detection signal is a first current; and the second detection signal is a second current.

According to some embodiments, a controller for a power converter includes: a first gate driver configured to output a first drive signal to a first transistor related to a primary winding, the first transistor including a drain terminal and a source terminal, the primary winding being configured to receive an input voltage, the primary being coupled to a first auxiliary winding and a second auxiliary winding; one or more voltage detectors configured to generate a first detection signal and a second detection signal based at least in part on a current signal related to the first auxiliary winding; a time controller configured to receive the first detection signal and the second detection signal and generate a control signal based at least in part on the first detection signal and the second detection signal; and a second gate driver configured to receive the control signal, generate a second drive signal based at least in part on the control signal, and output the second drive signal to a second transistor related to the second auxiliary winding; wherein the one or more voltage detectors are further configured to: at a first time when the first drive signal is at a first logic level and the second drive signal is at a second logic level, detect the input voltage based at least in part on the current signal; and at a second time when the first drive signal is at the second logic level and the second drive signal is also at the second logic level, detect the input voltage minus a voltage drop from the drain terminal to the source terminal of the first transistor based at least in part on the current signal; wherein the one or more voltage detectors are further configured to: generate the first detection signal representing the input voltage at the first time; and generate the second detection signal representing the input voltage minus the voltage drop from the drain terminal to the source terminal of the first transistor at the second time; wherein the time controller is further configured to: determine the voltage drop from the drain terminal to the source terminal of the first transistor based at least in part on the first detection signal and the second detection; if the determined voltage drop from the drain terminal to the source terminal of the first transistor is larger than a first threshold, increase a time duration when the second drive signal remains at the first logic level; and if the determined voltage drop from the drain terminal to the source terminal of the first transistor is smaller than a second threshold, decrease the time duration when the second drive signal remains at the first logic level; wherein the first threshold is larger than the second threshold. For example, the controller for the power converter is implemented according to at least FIG. 5. As an example, the time controller is further configured to: if the determined voltage drop from the drain terminal to the source terminal of the first transistor is smaller than the first threshold but larger than the second threshold, keep the time duration when the second drive signal remains at the first logic level constant.

According to certain embodiments, a method for a power converter includes: outputting a first drive signal to a first transistor related to a primary winding, the first transistor including a drain terminal and a source terminal, the primary winding being configured to receive an input voltage, the primary being coupled to a first auxiliary winding and a second auxiliary winding; detecting the input voltage based at least in part on a current signal related to the first auxiliary winding at a first time when the first drive signal is at a first logic level and the second drive signal is at a second logic level; detecting the input voltage minus a voltage drop from the drain terminal to the source terminal of the first transistor based at least in part on the current signal at a second time when the first drive signal is at the second logic level and the second drive signal is also at the second logic level; generating the first detection signal representing the input voltage at the first time; generating the second detection signal representing the input voltage minus the voltage drop from the drain terminal to the source terminal of the first transistor at the second time; receiving the first detection signal and the second detection signal; determining the voltage drop from the drain terminal to the source terminal of the first transistor based at least in part on the first detection signal and the second detection; determining a time duration when the second drive signal remains at the first logic level based at least in part on the determined voltage drop from the drain terminal to the source terminal of the first transistor; generating a control signal based at least in part on the determined time duration; receiving the control signal; generating a second drive signal based at least in part on the control signal; and outputting the second drive signal to a second transistor related to the second auxiliary winding. For example, the method for the power converter is implemented according to at least FIG. 5.

For example, some or all components of various embodiments of the present invention each are, individually and/or in combination with at least another component, implemented using one or more software components, one or more hardware components, and/or one or more combinations of software and hardware components. As an example, some or all components of various embodiments of the present invention each are, individually and/or in combination with at least another component, implemented in one or more circuits, such as one or more analog circuits and/or one or more digital circuits. For example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments.

What is claimed is:

1. A controller for a power converter, the controller comprising:
 a first gate driver configured to output a first drive signal to a first transistor related to a primary winding, the first transistor including a drain terminal and a source terminal, the primary winding being configured to receive an input voltage, the primary being coupled to a first auxiliary winding and a second auxiliary winding;
 one or more voltage detectors configured to generate a first detection signal and a second detection signal based at least in part on a current signal related to the first auxiliary winding;

a time controller configured to receive the first detection signal and the second detection signal and generate a control signal based at least in part on the first detection signal and the second detection signal; and a second gate driver configured to receive the control signal, generate a second drive signal based at least in part on the control signal, and output the second drive signal to a second transistor related to the second auxiliary winding;

wherein the one or more voltage detectors are further configured to:
at a first time when the first drive signal is at a first logic level and the second drive signal is at a second logic level, detect the input voltage based at least in part on the current signal; and
at a second time when the first drive signal is at the second logic level and the second drive signal is also at the second logic level, detect the input voltage minus a voltage drop from the drain terminal to the source terminal of the first transistor based at least in part on the current signal;

wherein the one or more voltage detectors are further configured to:
generate the first detection signal representing the input voltage at the first time; and
generate the second detection signal representing the input voltage minus the voltage drop from the drain terminal to the source terminal of the first transistor at the second time;

wherein the time controller is further configured to:
determine the voltage drop from the drain terminal to the source terminal of the first transistor based at least in part on the first detection signal and the second detection; and
determine a time duration when the second drive signal remains at the first logic level based at least in part on the determined voltage drop from the drain terminal to the source terminal of the first transistor.

2. The controller of claim 1 wherein the time controller is further configured to:
if the determined voltage drop from the drain terminal to the source terminal of the first transistor is larger than a first threshold, increase the time duration when the second drive signal remains at the first logic level; and
if the determined voltage drop from the drain terminal to the source terminal of the first transistor is smaller than a second threshold, decrease the time duration when the second drive signal remains at the first logic level;
wherein the first threshold is larger than the second threshold.

3. The controller of claim 2 wherein the time controller is further configured to:
if the determined voltage drop from the drain terminal to the source terminal of the first transistor is smaller than the first threshold but larger than the second threshold, not change the time duration when the second drive signal remains at the first logic level.

4. The controller of claim 2 wherein the time controller includes a processing and comparison unit and a control signal generator.

5. The controller of claim 4 wherein the processing and comparison unit is configured to:
receive the first detection signal and the second detection signal; and
determine the voltage drop from the drain terminal to the source terminal of the first transistor based at least in part on the first detection signal and the second detection.

6. The controller of claim 5 wherein the processing and comparison unit is further configured to:
compare the determined voltage drop from the drain terminal to the source terminal of the first transistor with the first threshold; and
compare the determined voltage drop from the drain terminal to the source terminal of the first transistor with the second threshold.

7. The controller of claim 6 wherein the processing and comparison unit is further configured to:
generate a first comparison signal indicating whether the determined voltage drop from the drain terminal to the source terminal of the first transistor becomes larger than the first threshold; and
generate a second comparison signal indicating whether the determined voltage drop from the drain terminal to the source terminal of the first transistor becomes smaller than the second threshold.

8. The controller of claim 7 wherein the control signal generator is configured to receive the first comparison signal and the second comparison signal.

9. The controller of claim 8 wherein the control signal generator is further configured to, if the first comparison signal indicates that the determined voltage drop from the drain terminal to the source terminal of the first transistor becomes larger than the first threshold:
generate a first pulse in a first pulse signal; and
use the first pulse in the first pulse signal to increase the time duration when the second drive signal remains at the first logic level.

10. The controller of claim 8 wherein the control signal generator is further configured to, if the second comparison signal indicates that the determined voltage drop from the drain terminal to the source terminal of the first transistor becomes smaller than the second threshold:
generate a second pulse in a second pulse signal; and
use the second pulse in the second pulse signal to decrease the time duration when the second drive signal remains at the first logic level.

11. The controller of claim 1 wherein the first gate driver is further configured to:
generate the first drive signal at the first logic level to turn on the first transistor; and
generate the first drive signal at the second logic level to turn off the first transistor.

12. The controller of claim 11 wherein the second gate driver is further configured to:
generate the second drive signal at the first logic level to turn on the second transistor; and
generate the second drive signal at the second logic level to turn off the second transistor.

13. The controller of claim 1 wherein:
the first logic level is a logic high level; and
the second logic level is a logic low level.

14. The controller of claim 1 wherein the one or more voltage detectors include one voltage detector configured to generate the first detection signal and the second detection signal based at least in part on the current signal.

15. The controller of claim 1 wherein:
the one or more voltage detectors include a first voltage detector and a second voltage detector;

wherein:
the first voltage detector is configured to generate the first detection signal based at least in part on the current signal; and
the second voltage detector is configured to generate the second detection signal based at least in part on the current signal.

16. The controller of claim 1 wherein:
the first detection signal is a first voltage; and
the second detection signal is a second voltage.

17. The controller of claim 1 wherein:
the first detection signal is a first current; and
the second detection signal is a second current.

18. A controller for a power converter, the controller comprising:
a first gate driver configured to output a first drive signal to a first transistor related to a primary winding, the first transistor including a drain terminal and a source terminal, the primary winding being configured to receive an input voltage, the primary being coupled to a first auxiliary winding and a second auxiliary winding;
one or more voltage detectors configured to generate a first detection signal and a second detection signal based at least in part on a current signal related to the first auxiliary winding;
a time controller configured to receive the first detection signal and the second detection signal and generate a control signal based at least in part on the first detection signal and the second detection signal; and
a second gate driver configured to receive the control signal, generate a second drive signal based at least in part on the control signal, and output the second drive signal to a second transistor related to the second auxiliary winding;
wherein the one or more voltage detectors are further configured to:
at a first time when the first drive signal is at a first logic level and the second drive signal is at a second logic level, detect the input voltage based at least in part on the current signal; and
at a second time when the first drive signal is at the second logic level and the second drive signal is also at the second logic level, detect the input voltage minus a voltage drop from the drain terminal to the source terminal of the first transistor based at least in part on the current signal;
wherein the one or more voltage detectors are further configured to:
generate the first detection signal representing the input voltage at the first time; and
generate the second detection signal representing the input voltage minus the voltage drop from the drain terminal to the source terminal of the first transistor at the second time;
wherein the time controller is further configured to:
determine the voltage drop from the drain terminal to the source terminal of the first transistor based at least in part on the first detection signal and the second detection;
if the determined voltage drop from the drain terminal to the source terminal of the first transistor is larger than a first threshold, increase a time duration when the second drive signal remains at the first logic level; and
if the determined voltage drop from the drain terminal to the source terminal of the first transistor is smaller than a second threshold, decrease the time duration when the second drive signal remains at the first logic level;
wherein the first threshold is larger than the second threshold.

19. The controller of claim 18 wherein the time controller is further configured to:
if the determined voltage drop from the drain terminal to the source terminal of the first transistor is smaller than the first threshold but larger than the second threshold, keep the time duration when the second drive signal remains at the first logic level constant.

20. A method for a power converter, the method comprising:
outputting a first drive signal to a first transistor related to a primary winding, the first transistor including a drain terminal and a source terminal, the primary winding being configured to receive an input voltage, the primary being coupled to a first auxiliary winding and a second auxiliary winding;
detecting the input voltage based at least in part on a current signal related to the first auxiliary winding at a first time when the first drive signal is at a first logic level and the second drive signal is at a second logic level;
detecting the input voltage minus a voltage drop from the drain terminal to the source terminal of the first transistor based at least in part on the current signal at a second time when the first drive signal is at the second logic level and the second drive signal is also at the second logic level;
generating the first detection signal representing the input voltage at the first time;
generating the second detection signal representing the input voltage minus the voltage drop from the drain terminal to the source terminal of the first transistor at the second time;
receiving the first detection signal and the second detection signal;
determining the voltage drop from the drain terminal to the source terminal of the first transistor based at least in part on the first detection signal and the second detection;
determining a time duration when the second drive signal remains at the first logic level based at least in part on the determined voltage drop from the drain terminal to the source terminal of the first transistor;
generating a control signal based at least in part on the determined time duration;
receiving the control signal;
generating a second drive signal based at least in part on the control signal; and
outputting the second drive signal to a second transistor related to the second auxiliary winding.

* * * * *